US007005862B2

(12) United States Patent
Onodera

(10) Patent No.: US 7,005,862 B2
(45) Date of Patent: Feb. 28, 2006

(54) METHOD AND APPARATUS FOR MEASURING ELECTRIC CHARACTERISTICS OF CABLE ASSEMBLY, AND COMPUTER PRODUCT

(75) Inventor: Yasushi Onodera, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/094,579

(22) Filed: Mar. 31, 2005

(65) Prior Publication Data

US 2005/0168229 A1 Aug. 4, 2005

Related U.S. Application Data

(63) Continuation of application No. PCT/JP03/01966, filed on Feb. 24, 2003.

(51) Int. Cl.
*G01R 31/11* (2006.01)
*G01R 27/32* (2006.01)

(52) U.S. Cl. .................. 324/533; 324/535; 324/646
(58) Field of Classification Search ............. 324/533, 324/534, 535, 646
See application file for complete search history.

(56) References Cited

U.S. PATENT DOCUMENTS 5,420,512 A * 5/1995 Spillane et al. ............. 324/539
5,867,030 A 2/1999 Sato
6,037,780 A 3/2000 Ohtaki
6,486,676 B1 * 11/2002 Noe ........................... 324/534
6,580,278 B1 * 6/2003 Harrison ..................... 324/646
6,825,672 B1 * 11/2004 Lo et al. ..................... 324/533
6,853,198 B1 * 2/2005 Boudiaf et al. ............. 324/601

FOREIGN PATENT DOCUMENTS

| JP | 62-199127 | 9/1987 |
| JP | 63-191979 | 8/1988 |
| JP | 08-036037 | 2/1996 |
| JP | 10-038938 | 2/1998 |
| JP | 2001-338541 | 12/2001 |

* cited by examiner

*Primary Examiner*—Anjan Deb
*Assistant Examiner*—Jeff Natalini
(74) *Attorney, Agent, or Firm*—Westerman, Hattori, Daniels & Adrian, LLP

(57) ABSTRACT

A propagation delay time of a cable assembly is measured by calculating a half of a time difference between a branch point of time-dependent variations of amplitude of reflection coefficient obtained by connecting a first connector with both terminals open-circuited and a second connector with one terminal short-circuited to a conversion adaptor in turn and a branch point of the time-dependent variations of the amplitude of reflection coefficient obtained by connecting one terminal of the cable assembly with other terminal connected to the first connector and one terminal of the cable assembly with other terminal connected to the second connector to the conversion adaptor in turn.

22 Claims, 18 Drawing Sheets

FIG.10

| PIN NO. | MEASUREMENT A (ns/m) | MEASUREMENT B (ns/m) | DIFFERENCE (A-B) (ps/m) | DIFFERENCE (A-B) SQUARED (ps/m) |
|---|---|---|---|---|
| 1 | 4.600 | 4.605 | 5 | 25 |
| 2 | 4.610 | 4.615 | 5 | 25 |
| 3 | 4.625 | 4.625 | 0 | 0 |
| 4 | 4.605 | 4.610 | 5 | 25 |
| 5 | 4.615 | 4.610 | 0 | 25 |
| 6 | 4.600 | 4.600 | 0 | 0 |
| 7 | 4.615 | 4.615 | 0 | 0 |
| 8 | 4.605 | 4.610 | 5 | 25 |
| 9 | 4.615 | 4.615 | 0 | 0 |
| 10 | 4.600 | 4.605 | 5 | 25 |
| MAXIMUM | 4.625 | 4.625 | 5 | 25 |
| MINIMUM | 4.600 | 4.600 | 0 | 0 |
| TOLERANCE | 0.025 | 0.025 | — | — |
| AVERAGE | 4.609 | 4.611 | — | 15 |

FIG.11

| PIN NO. | MEASUREMENT A (ns/m) | MEASUREMENT B (ns/m) | DIFFERENCE (A-B) (ps/m) | DIFFERENCE (A-B) SQUARED (ps/m) |
|---|---|---|---|---|
| 1 | 4.580 | 4.580 | 0 | 0 |
| 2 | 4.595 | 4.600 | 5 | 25 |
| 3 | 4.605 | 4.595 | 10 | 100 |
| 4 | 4.595 | 4.595 | 0 | 0 |
| 5 | 4.600 | 4.585 | 15 | 225 |
| 6 | 4.590 | 4.575 | 15 | 225 |
| 7 | 4.595 | 4.590 | 5 | 25 |
| 8 | 4.595 | 4.590 | 5 | 25 |
| 9 | 4.600 | 4.590 | 10 | 100 |
| 10 | 4.585 | 4.585 | 0 | 0 |
| MAXIMUM | 4.605 | 4.600 | 15 | 225 |
| MINIMUM | 4.580 | 4.575 | 0 | 0 |
| TOLERANCE | 0.025 | 0.025 | — | — |
| AVERAGE | 4.596 | 4.589 | — | 72 |

FIG.15
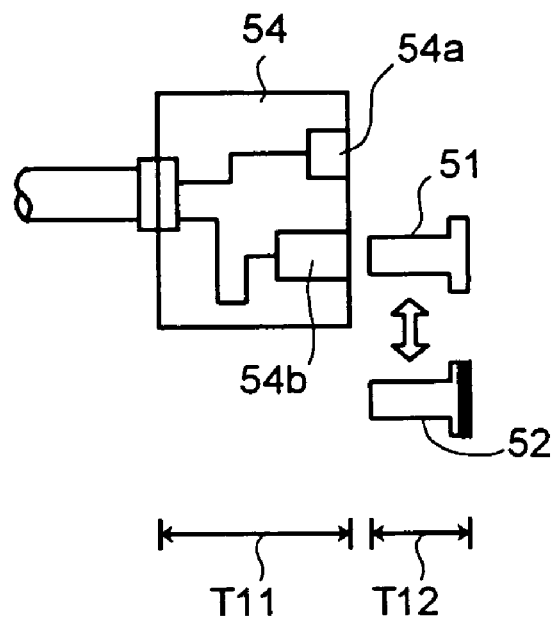
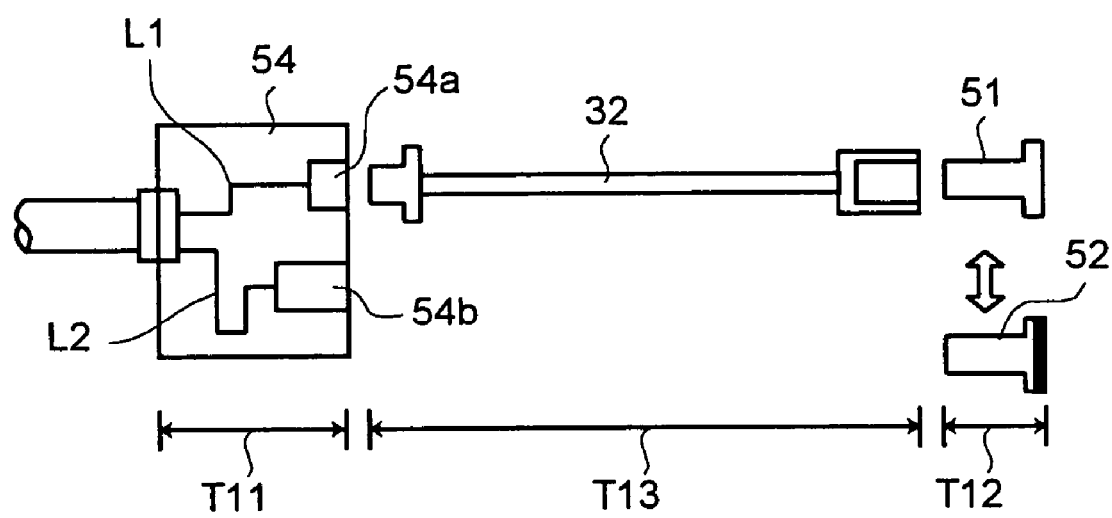

US 7,005,862 B2

METHOD AND APPARATUS FOR MEASURING ELECTRIC CHARACTERISTICS OF CABLE ASSEMBLY, AND COMPUTER PRODUCT

CROSS REFERENCE

The present application is a continuation of PCT/JP03/01966 filed Feb. 24, 2003.

BACKGROUND OF THE INVENTION

1. Field of the Invention

This invention relates to a technology for measuring a propagation delay time of a cable assembly with a high precision.

2. Description of the Related Art

In a notebook personal computer and the like, a downsizing and a weight reduction as well as an increase in speed and resolution are currently in progress, which requires a cable assembly having a high-speed transmission capability. With increasing speed of signal transmission in a cable, a range of skew, which is a difference in a propagation delay time that is allowed for the cable assembly, is getting narrower. This is because when a difference in the propagation delay time occurs, the synchronization between signals tends to shift and errors of signals tend to occur. In the case of high-speed transmission, a particularly small difference in the propagation delay time is required. For this reason, it is necessary to measure the difference of the propagation delay time to check if the difference of the propagation delay time is within a predetermined range.

FIG. 20 is a schematic for explaining the measurement of a propagation delay time of a cable assembly 30 using a conventional measuring apparatus 110. The measuring apparatus 110 includes a conversion adapter 104, to which a proximal end 30a of the cable assembly 30 is connected directly. The distal end 30b of the cable assembly 30 is electrically open. In this connection state, the measuring apparatus 110 transmits a signal having a predetermined frequency to the cable assembly 30, reflection of the signal occurs at a position where impedance mismatches to generate a reflected wave. In the measuring apparatus 110, time-dependent variation of amplitude of reflection coefficient ρ as a ratio of reflected wave to input wave is obtained, from which a propagation delay time Td is obtained, as shown in FIG. 21.

The time-dependent variation of the amplitude of reflection coefficient ρ obtained in the manner explained in FIG. 21, the amplitude of reflection coefficient ρ increases rapidly with time first at a point PP1 that corresponds to near the proximal end 30a of the cable assembly and then at a point PP2 that corresponds to the proximal end of the cable assembly 30, which proximal end is an open end. The time-dependent variation of the amplitude of reflection coefficient ρ is output to a displaying unit 107 of the measuring apparatus 110. The measurer visually measures a rapidly changing difference in time between the two points PP1 and PP2 and a half of the difference in time is defined as a propagation delay time. This measurement method is called an open method since the distal end 30b of the cable assembly is open.

On the other hand, a short-circuit method with which the distal end 30b of the cable assembly is short-circuited and then a propagation delay time is obtained. According to the short-circuit method, the distal end 30a of the cable assembly 30 is short-circuited with a short-circuiting pin 130 before the propagation delay time can be obtained. FIG. 23 is a schematic for explaining time-dependent variation of the amplitude of reflection coefficient obtained by the conventional short-circuit method. The amplitude of reflection coefficient ρ rapidly decreases at the point PP2 that corresponds to the distal end 30a of the cable assembly 30, which is different from the time-dependent variation of the amplitude of reflection coefficient ρ obtained by the open method. However, also in the short-circuit method, a half of a difference in time between the points PP1 and PP2 at which the amplitude of reflection coefficient ρ rapidly changes is defined as a propagation delay time.

When either the open method or short-circuit method is used, near the points PP1 and PP2, the amplitude of reflection coefficient varies drastically billows with high amplitudes. Accordingly, the measurer may wrongly read the position of the point PP1, which makes it difficult to perform the measurement of propagation delay times with a high precision. For example, the position of the point PP1 is read to be Pt1 or Pt2.

This means that the error by the measurer increases and the propagation delay time is measured with a low precision.

SUMMARY OF THE INVENTION

It is an object of the present invention to solve at least the above problems in the conventional technology.

An apparatus according to one aspect of the present invention, which is for measuring electric characteristics of a cable assembly that is connected to the apparatus via a connecting unit, by outputting a predetermined frequency signal to the cable assembly, measuring an amplitude of reflection coefficient of the predetermined frequency signal, and calculating a propagation delay time of the cable assembly based on a time-dependent variation of the amplitude of reflection coefficient, includes a reflection-coefficient measuring unit that measures the time-dependent variation of the amplitude of reflection coefficient in each of connection states including a first connection state in which a first connector with both terminals open-circuited is connected to the connecting unit, a second connection state in which one terminal of a second connector with other terminal short-circuited, having same propagation delay time as that of the first connector, is connected to the connecting unit, a third connection state in which one terminal of the cable assembly is connected to the connecting unit, and other terminal of the cable assembly is connected to the first connector, and a fourth connection state in which one terminal of the cable assembly is connected to the connecting unit, and other terminal of the cable assembly is connected to the second connector; and an output processing unit that visually outputs a superposition of the time-dependent variations of the amplitude of reflection coefficient in the first and the second connection states or a superposition of the time-dependent variations of the amplitude of reflection coefficient in the third and the fourth connection states. A half of a time difference between a branch point of the time-dependent variations of the amplitude of reflection coefficient in the first and the second connection states and a branch point of the time-dependent variations of the amplitude of reflection coefficient in the third and the fourth connection states is obtained as the propagation delay time.

An apparatus according to another aspect of the present invention, which is for measuring electric characteristics of a cable assembly that is connected to the apparatus via a connecting unit, by outputting a predetermined frequency signal to the cable assembly, measuring an amplitude of reflection coefficient of the predetermined frequency signal, and calculating a propagation delay time of the cable assembly based on a time-dependent variation of the amplitude of reflection coefficient, includes a reflection-coefficient measuring unit that measures the time-dependent variation of the amplitude of reflection coefficient in each of connection states including a first connection state in which a first connector with both terminals open-circuited is connected to the connecting unit, a second connection state in which one terminal of a second connector with other terminal short-circuited, having same propagation delay time as that of the first connector, is connected to the connecting unit, a third connection state in which one terminal of the cable assembly is connected to the connecting unit, and other terminal of the cable assembly is connected to the first connector, and a fourth connection state in which one terminal of the cable assembly is connected to the connecting unit, and other terminal of the cable assembly is connected to the second connector; and a time-difference calculating unit that obtains a first branch point in a superposition of the time-dependent variations of the amplitude of reflection coefficient in the first and the second connection states and a second branch point in a superposition of the time-dependent variations of the amplitude of reflection coefficient in the third and the fourth connection states, calculates a time difference between the first branch point and the second branch point, and outputs a half of the time difference as the propagation delay time.

A computer-readable recording medium according to still another aspect of the present invention stores a computer program for measuring electric characteristics of a cable assembly that is connected via a connecting unit, by outputting a predetermined frequency signal to the cable assembly, measuring an amplitude of reflection coefficient of the predetermined frequency signal, and calculating a propagation delay time of the cable assembly based on a time-dependent variation of the amplitude of reflection coefficient. The computer program makes a computer execute a first measurement processing including measuring the time-dependent variation of the amplitude of reflection coefficient in a first connection state in which a first connector with both terminals open-circuited is connected to the connecting unit and a second connection state in which one terminal of a second connector with other terminal short-circuited, having same propagation delay time as that of the first connector, is connected to the connecting unit; a first output processing including outputting visually a superposition of the time-dependent variations of the amplitude of reflection coefficient measured at the first measurement processing; a second measurement processing including measuring the time-dependent variation of the amplitude of reflection coefficient in a third connection state in which one terminal of the cable assembly is connected to the connecting unit, and other terminal of the cable assembly is connected to the first connector and a fourth connection state in which one terminal of the cable assembly is connected to the connecting unit, and other terminal of the cable assembly is connected to the second connector; and a second output processing including outputting visually a superposition of the time-dependent variations of the amplitude of reflection coefficient measured at the second measurement processing.

A computer-readable recording medium according to still another aspect of the present invention stores a computer program for measuring electric characteristics of a cable assembly that is connected via a connecting unit, by outputting a predetermined frequency signal to the cable assembly, measuring an amplitude of reflection coefficient of the predetermined frequency signal, and calculating a propagation delay time of the cable assembly based on a time-dependent variation of the amplitude of reflection coefficient. The computer program makes a computer execute measuring the time-dependent variation of the amplitude of reflection coefficient in a first connection state in which a first connector with both terminals open-circuited is connected to the connecting unit, a second connection state in which one terminal of a second connector with other terminal short-circuited, having same propagation delay time as that of the first connector, is connected to the connecting unit, a third connection state in which one terminal of the cable assembly is connected to the connecting unit, and other terminal of the cable assembly is connected to the first connector, and a fourth connection state in which one terminal of the cable assembly is connected to the connecting unit, and other terminal of the cable assembly is connected to the second connector; and outputting visually a superposition of the time-dependent variations of the amplitude of reflection coefficient measured at the measuring.

A computer-readable recording medium according to still another aspect of the present invention stores a computer program for measuring electric characteristics of a cable assembly that is connected via a connecting unit, by outputting a predetermined frequency signal to the cable assembly, measuring an amplitude of reflection coefficient of the predetermined frequency signal, and calculating a propagation delay time of the cable assembly based on a time-dependent variation of the amplitude of reflection coefficient. The computer program makes a computer execute measuring the time-dependent variation of the amplitude of reflection coefficient in a first connection state in which a first connector with both terminals open-circuited is connected to the connecting unit, a second connection state in which one terminal of a second connector with other terminal short-circuited, having same propagation delay time as that of the first connector, is connected to the connecting unit, a third connection state in which one terminal of the cable assembly is connected to the connecting unit, and other terminal of the cable assembly is connected to the first connector, and a fourth connection state in which one terminal of the cable assembly is connected to the connecting unit, and other terminal of the cable assembly is connected to the second connector; detecting a first branch point of the time-dependent variations of the amplitude of reflection coefficient in the first and the second connection states, and a second branch point of the time-dependent variations of the amplitude of reflection coefficient in the third and the fourth connection states; and calculating a half of a time difference between the first branch point and the second branch point as the propagation delay time.

A method according to still another aspect of the present invention, which is for measuring electric characteristics of a cable assembly that is connected via a connecting unit, by outputting a predetermined frequency signal to the cable assembly, measuring an amplitude of reflection coefficient of the predetermined frequency signal, and calculating a propagation delay time of the cable assembly based on a time-dependent variation of the amplitude of reflection coefficient, includes a first measurement processing including measuring the time-dependent variation of the amplitude of reflection coefficient in a first connection state in which a first connector with both terminals open-circuited is connected to the connecting unit and a second connection state in which one terminal of a second connector with other terminal short-circuited, having same propagation delay time as that of the first connector, is connected to the connecting unit; a first output processing including outputting visually a superposition of the time-dependent variations of the amplitude of reflection coefficient measured at the first measurement processing; a second measurement processing including measuring the time-dependent variation of the amplitude of reflection coefficient in a third connection state in which one terminal of the cable assembly is connected to the connecting unit, and other terminal of the cable assembly is connected to the first connector and a fourth connection state in which one terminal of the cable assembly is connected to the connecting unit, and other terminal of the cable assembly is connected to the second connector; and a second output processing including outputting visually a superposition of the time-dependent variations of the amplitude of reflection coefficient measured at the second measurement processing. A half of a time difference between a branch point of the time-dependent variations of the amplitude of reflection coefficient measured at the first measurement processing and a branch point of the time-dependent variations of the amplitude of reflection coefficient measured at the second measurement processing is obtained as the propagation delay time.

A method according to still another aspect of the present invention, which is for measuring electric characteristics of a cable assembly that is connected via a connecting unit, by outputting a predetermined frequency signal to the cable assembly, measuring an amplitude of reflection coefficient of the predetermined frequency signal, and calculating a propagation delay time of the cable assembly based on a time-dependent variation of the amplitude of reflection coefficient, includes measuring the time-dependent variation of the amplitude of reflection coefficient in a first connection state in which a first connector with both terminals open-circuited is connected to the connecting unit, a second connection state in which one terminal of a second connector with other terminal short-circuited, having same propagation delay time as that of the first connector, is connected to the connecting unit, a third connection state in which one terminal of the cable assembly is connected to the connecting unit, and other terminal of the cable assembly is connected to the first connector, and a fourth connection state in which one terminal of the cable assembly is connected to the connecting unit, and other terminal of the cable assembly is connected to the second connector; and outputting visually a superposition of the time-dependent variations of the amplitude of reflection coefficient measured at the measuring. A half of a time difference between a branch point of the time-dependent variations of the amplitude of reflection coefficient in the first and the second connection states and a branch point of the time-dependent variations of the amplitude of reflection coefficient in the third and the fourth connection states is obtained as the propagation delay time.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 10 is a table of results of measurement of the propagation delay time of a cable assembly by the measuring apparatus according to the first embodiment;

FIG. 11 is a table of results of measurement of the propagation delay time of a cable assembly by a conventional open method;

FIG. 15 is a schematic cross-section of an example of a connector used when connectors at both ends of a cable assembly have different shapes;

DETAILED DESCRIPTION

Exemplary embodiments of the present invention are explained with reference to the accompanying drawings.

Figure 1:
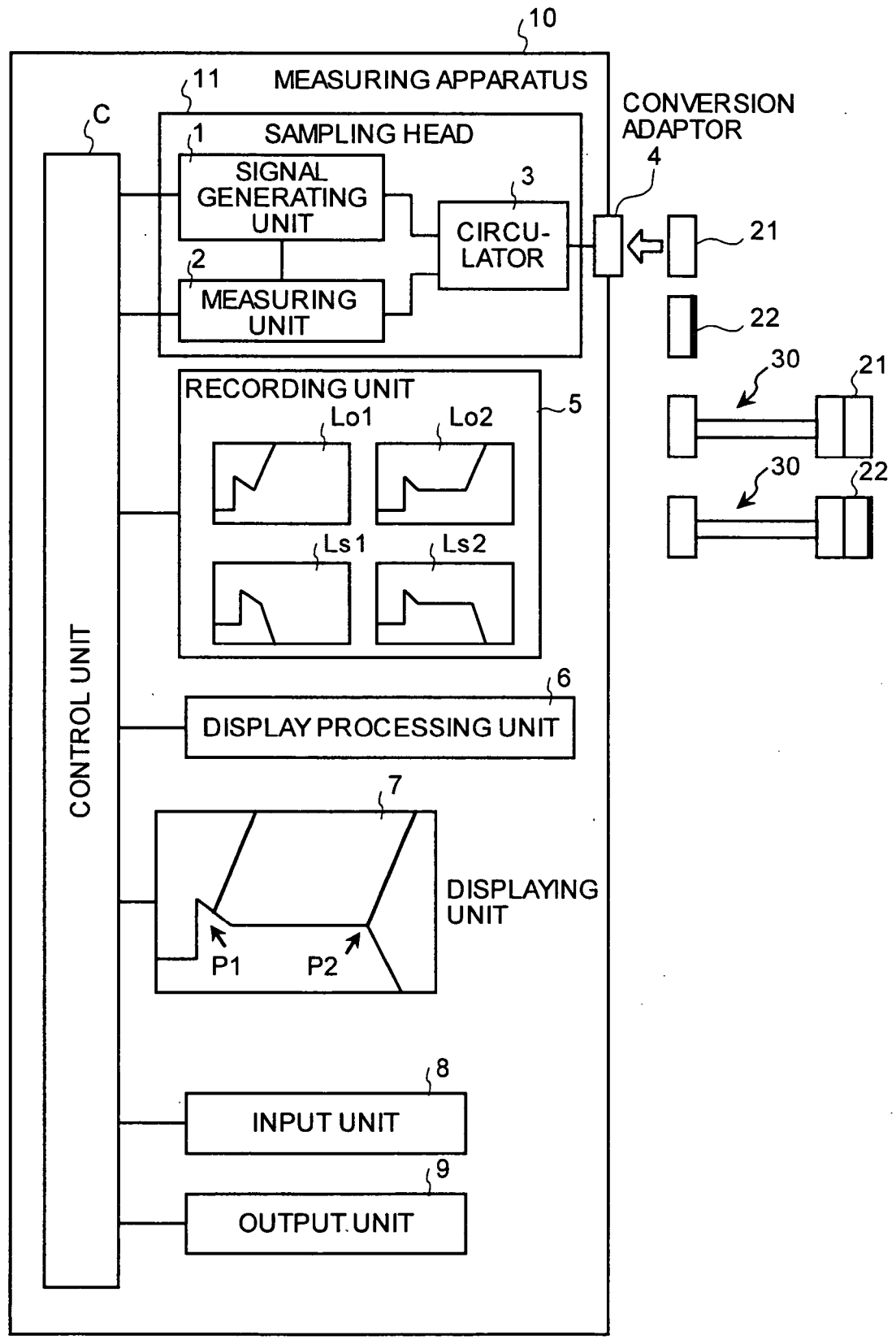
FIG. 1 is a block diagram of a measuring apparatus according to a first embodiment of the present invention.

FIG. 1 is a block diagram of a measuring apparatus according to a first embodiment of the present invention. The measuring apparatus, which measures a propagation delay time of a cable assembly 30, includes a sampling head 11, a recording unit 5, and a display processing unit 6, a displaying unit 7, an input unit 8, an output unit 9, and a control unit C that controls these units.

The sampling head 11 has a signal generating unit 1, a measuring unit 2, and a circulator 3. To perform measurements using high frequency signals, the sampling head is carried to near the cable assembly and is connected to the body of a measuring apparatus 10. This high-frequency measurements with high precision while minimizing influences of cable length and so on. The signal generating unit 1 generates high frequency signals that the cable assembly 30 transmits. The signals are sent to the side of the cable assembly 30 through the circulator 3. The high frequency signals that reflect from the side of the cable assembly 30 are input to the measuring unit 2 through the circulator 3. The measuring unit 2 continuously measures the intensities of an input wave of the high frequency signal output by the signal generating unit 1 and of the reflected wave that returned from the cable assembly side. The measuring unit 2 calculates ratios of the intensity of the reflected wave to that of the input wave, i.e., an amplitude of reflection coefficient $\rho$, to obtain a time-dependent variation of the amplitude of reflection coefficient (hereafter, sometimes referred to simply as "time-dependent variation"), and outputs the results to the recording unit 5. As used herein, the term "measure an amplitude of reflection coefficient" means to measure intensities of an input wave and of a reflected wave, calculate or otherwise obtain ratios of the reflected waves to the input waves, and obtain a time-dependent variation of the ratio of the amplitude of reflection coefficient.

A conversion adaptor 4 is connected to the sampling head 11. Four members are connected in turn to the conversion adaptor 4 to realize four connection states. More particularly, a first connector 21, which has an open end, a second connector 22, which has a short-circuited end, the cable assembly 30 that is provided at the distal end thereof with the connector 21 and capable of connecting to the conversion adaptor 4 at the proximal end of the cable assembly 30, and the cable assembly 30 that is provided with the connector 22 at the distal thereof and capable of connecting to the conversion adaptor 4 at the proximal end of the cable assembly 30 are in turn connected to the conversion adaptor 4. The sampling head 11 measures the amplitude of reflection coefficient, $\rho$ in each connection states one after another to obtain time-dependent variations Lo1, Ls1, Lo1, and Lo2. The results of the measurement, i.e., the time-dependent variations Lo1, Ls1, Lo2, and Ls2 are recorded in respective recording areas 5a to 5d in the recording unit 5.

The display processing unit 6 processes the time-dependent variations Lo1 and Ls1 of the amplitude of reflection coefficients in the recording areas 5a and 5b and outputs the result to the displaying unit 7. The displaying unit displays the time-dependent variations Lo1 and Ls1 in superposition. The display processing unit 6 also processes the time-dependent variations Lo2 and Ls2 of the amplitude of reflection coefficients in the recording areas 5c and 5d and outputs the result to the displaying unit 7. The displaying unit displays the time-dependent variations Lo2 and Ls2 in superposition. The displaying unit 7 can be realized by, for example, a liquid crystal display (LCD).

The input unit 8 can be realized by pointing device, examples of which include a keyboard, a numeric keypad, an inputting panel, and a mouse. The input unit 8 inputs various kinds of instruction. The output unit 9, which can be realized by, for example, a printer, outputs prints in response to the instruction from the input unit 8. The input unit 8 and the output unit 9 may be modified in such a manner that inputs and outputs can be performed from outside via an inputting interface and an outputting interface, respectively.

Figure 2:
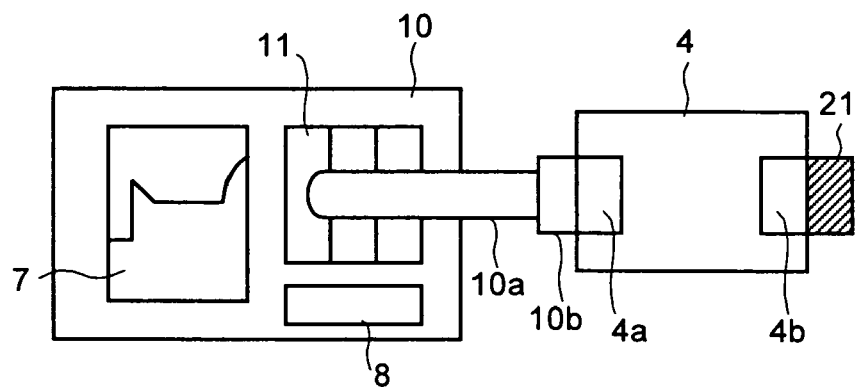
FIG. 2 is a schematic for explaining a state of connection between a conversion adapter of a measuring apparatus and a connector having an open end.
Figure 3:
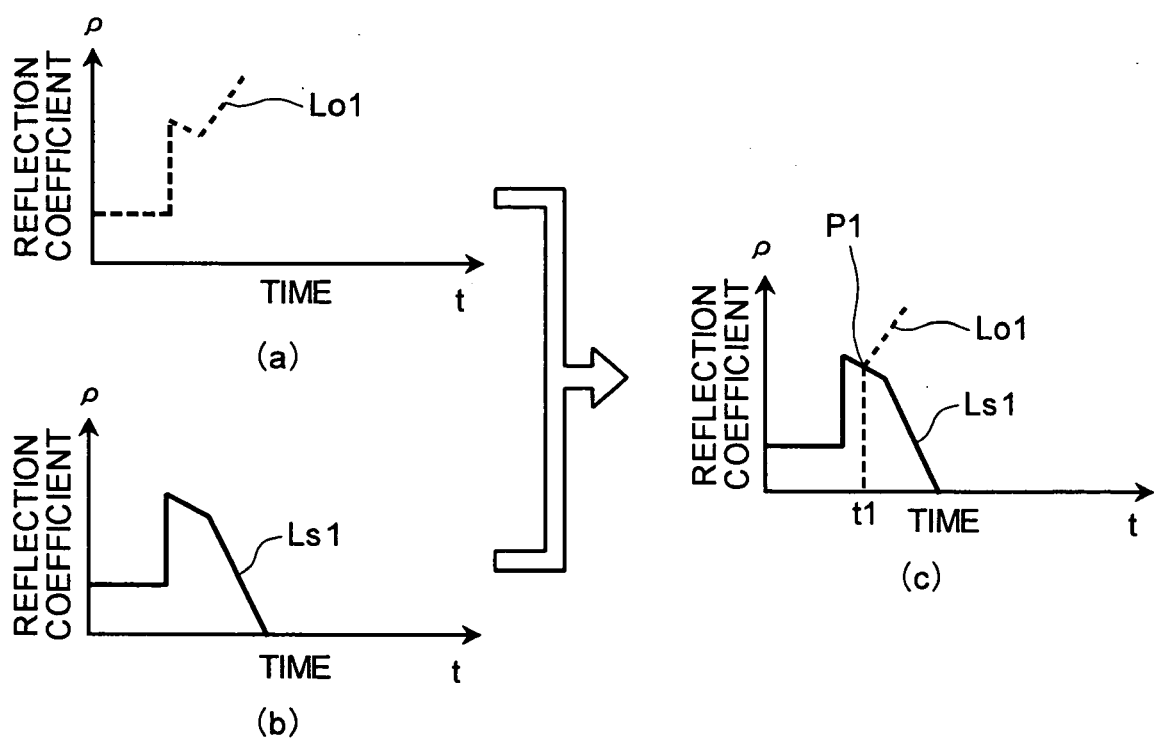
FIG. 3 is a schematic for explaining superposition of time-dependent variations of amplitude of reflection coefficients when a connector is open and when the connector short-circuits, respectively.

Measurement of propagation delay time using the measuring apparatus 10 is explained. As shown in FIG. 2, the sampling head 11 of the measuring apparatus 10 is connected to the conversion adaptor 4 via a coaxial cable 10a having a characteristic impedance of 50 ohms ($\Omega$) and a connector 10b of a shared memory architecture (SMA) type. First, the conversion adaptor 4 has a connector receptor 4b, to which the connector 21 that are in an open state in both the ends thereof is connected. The time-dependent variation Lo1 of the amplitude of reflection coefficient, $\rho$, as shown in (a) of FIG. 3 is measured and the result obtained is recorded in the recording unit 5. After the connector 21 is removed from the conversion adapter 4, the connector 22 having a short-circuited end is connected to the connector receptor 4b of the conversion adapter 4. The time-dependent variation Ls1 of the amplitude of reflection coefficient, $\rho$, as shown in (b) of FIG. 3 is measured and the result obtained is recorded in the recording unit 5. The display processing unit 6 obtains data of the time-dependent variations Lo1 and Ls1 recorded in the recording unit 5 and superposes the time-dependent variations Lo1 and Ls1 and outputs the result to the displaying unit 7. The displaying unit 7 displays the time-dependent variations Lo1 and Ls1 in superposition as shown in (c) of FIG. 3.

The time-dependent variation Lo1 of the amplitude of reflection coefficient $\rho$ is as follows. With time, due to an impedance mismatch between the connector 21 and the connector receptor 4b, reflected waves occur to increase the amplitude of reflection coefficient $\rho$ and the amplitude of reflection coefficient $\rho$ rapidly increases due to the open end of the connector 21. On the other hand, the time-dependent variation Ls1 of the amplitude of reflection coefficient $\rho$ is as follows. In the same manner as in the case of connecting the connector 21, reflected waves occur with time due to an impedance mismatch between the connector 22 and the connector receptor 4b to increase the amplitude of reflection coefficient $\rho$. However, the amplitude of reflection coefficient $\rho$ rapidly decreases due to the short-circuited end of the connector 22. When the time-dependent variations Lo1 and Ls1 of the amplitude of reflection coefficient $\rho$ are superposed, a branch point P1 at which the patterns or curves of the time-dependent variations of the reflection coefficient $\rho$ start to depart from each other can be visually observed objectively and with high precision as shown in (c) of FIG. 3. The branch point P1 corresponds to the position of the open end of the connector 21 and the short-circuited end of the connector 22. This can avoid errors of measurement by the measurer due to fluctuation of the time-dependent variation.

Figure 4:
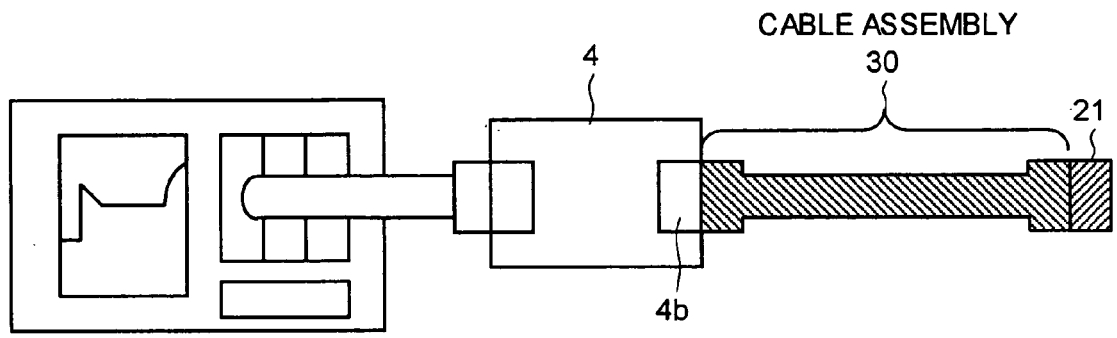
FIG. 4 is a schematic for explaining a state of connection between a conversion adapter of a measuring apparatus and a cable assembly with a connector having an open end, with a cable assembly connected.
Figure 5:
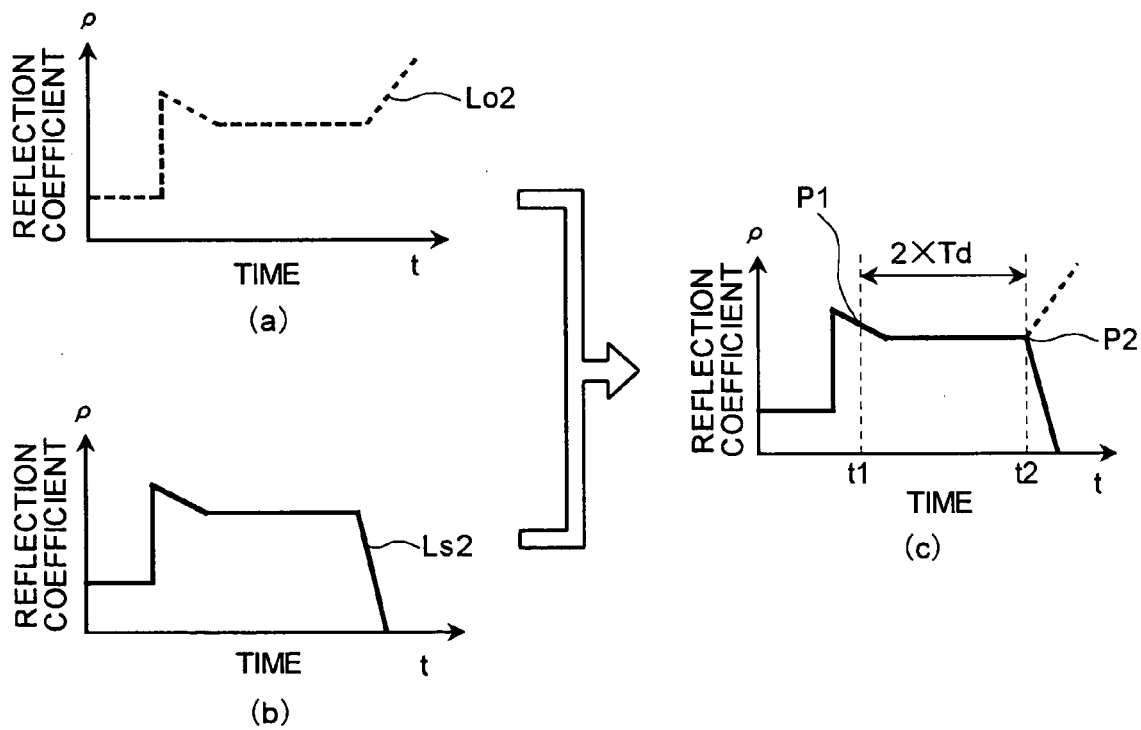
FIG. 5 is a schematic for explaining superposition of time-dependent variations of amplitude of reflection coefficients when a cable assembly is connected and a connector is open and when the cable assembly is connected and the connector short-circuits, respectively.

After the connector 22 is removed, the cable assembly 30 is connected to the connector receptor of the conversion adapter 4, as shown in FIG. 4. The connector 21 is connected to the distal end of the cable assembly 30. In this state, the time-dependent variation Lo2 of the amplitude: of reflection coefficient $\rho$ is measured and the result is recorded in the recording unit 5, as shown in FIG. 5. The cable assembly 30 with the connector 21 is removed from the adapter 4, and the connector 21 is removed from the cable assembly 30. Then, the connector 22 is connected to the cable assembly 30 and the cable assembly 30 with the connector 22 is connected to the connector receptor 4b of the conversion adapter 4 in such a manner that the proximal end of the cable assembly 30 is connected to the connector receptor 4b and the distal end of the cable assembly 30 is connected to the connector 22. In this state, the time-dependent variation Ls2 of the amplitude of reflection coefficient ρ is measured. The result is recorded in the recording unit 5. The display processing unit 6 superposes the time-dependent variations Lo2 and Ls2 and outputs these to the displaying unit 7, which displays the superposed data.

When the time-dependent variations Lo2 and Ls2 are superposed, the superposed time-dependent variation has a feature in that the branch point P1 of the time-dependent variations Lo2 and Ls2 shifts to some extent in the direction of increasing time. In the same manner as in the case of connecting the connector 21 or the connector 22 only, a branch point P2 is formed. The branch point P2 corresponds to the position of the open end of the connector 21 and the short-circuited end of the connector 22. At the branch point 2, the patterns or curves of the time-dependent variations Lo2 and Ls2 of the reflection coefficient ρ start to depart from each other considerably with time. As a result, the branch point 2 can be visually observed objectively and with high precision and errors of measurement by the measurer due to fluctuations of the time-dependent variation can be avoided.

A half of a difference between the time t1 at the branch point P1 and the time t2 at the branch point P2 is defined to be a propagation delay time "Td" of the cable assembly. The factor of ½ is used to indicate the time difference is the time in which the high frequency signals travels to and from.

Figure 6:
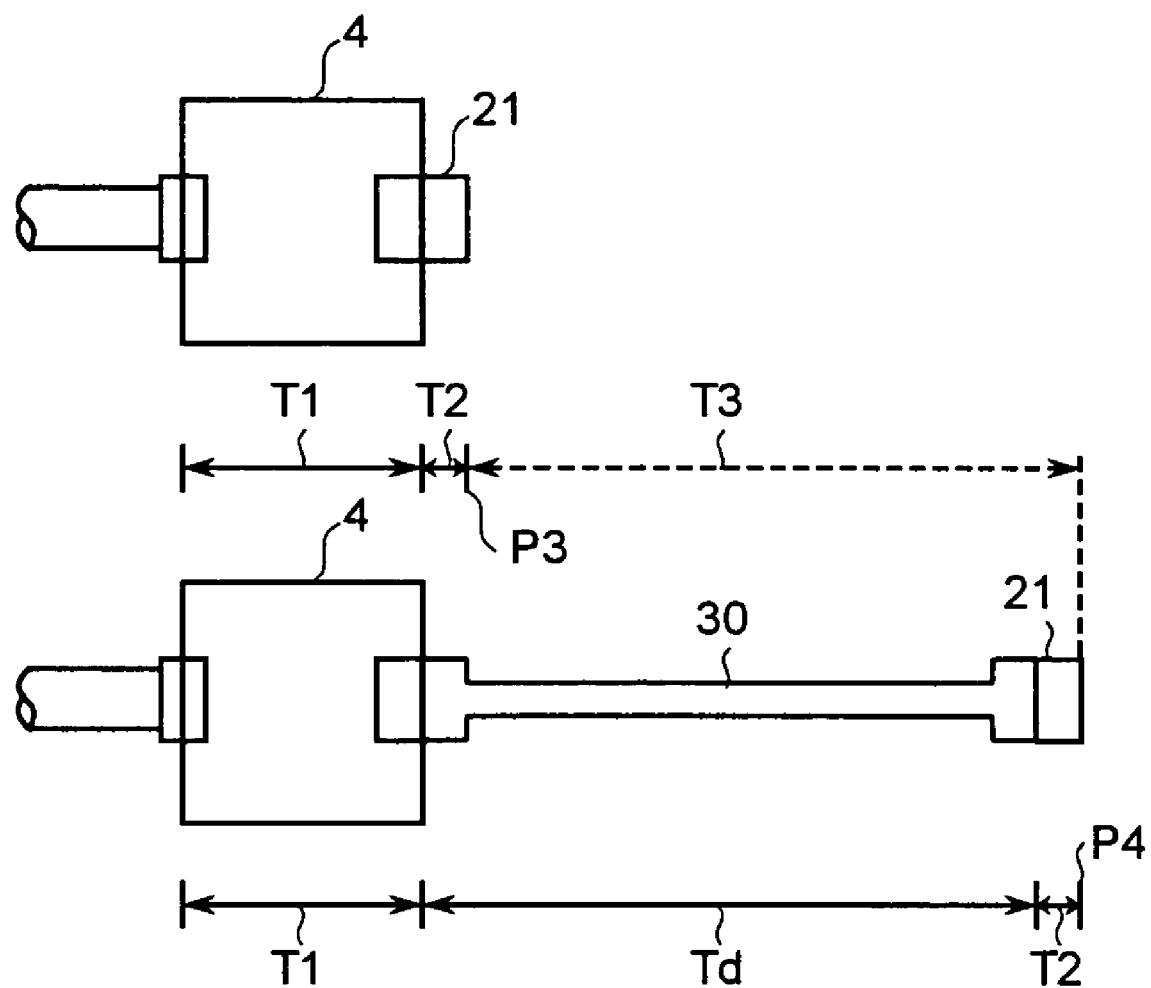
FIG. 6 is a schematic for explaining a principle on which measurement of propagation delay time is based.

As shown in FIG. 6, the propagation delay time T1 of the conversion adapter 4 itself is the same and the propagation delay time T2 of the connector 21 and the connector 22 themselves is the same between the upper configuration (the connector 21 only) and the lower configuration (the cable assembly 30 with the connector 21) and the propagation delay time T2 of the connector 21 or connector 22 itself is the same, propagation delay time T3 between the positions P3 and P4 that correspond to the branch points P1 and P2 is identical with the propagation delay time Td of the cable assembly 30 itself. Therefore, the propagation delay time Td of the cable assembly 30 can be obtained by determining the half of the difference in time t1 and time t2.

Figure 7:
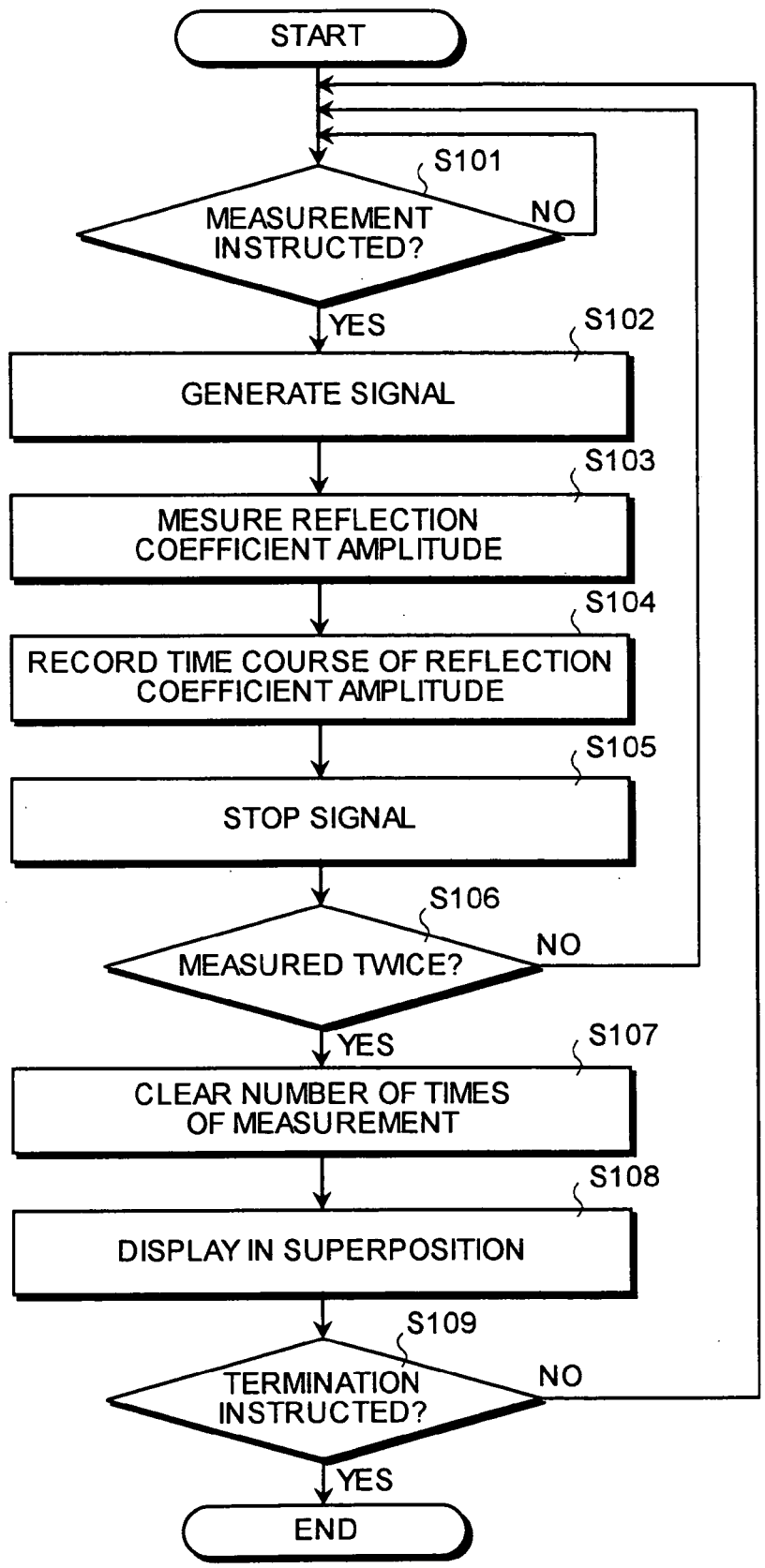
FIG. 7 is a flowchart of a procedure of measuring the propagation delay time of the cable assembly by the measuring apparatus according to the first embodiment.

Referring to FIG. 7, which is a flowchart of a procedure of measuring the propagation delay time of the cable assembly by the measuring apparatus according to the first embodiment, the procedure of measuring the propagation delay time of a cable assembly by the measuring apparatus 10 is explained. The control unit judges if instruction for measurement is received from the input unit 8 (step S101). When no instruction for measuring was received (step S101, NO), this judgment treatment is repeated. When the instruction was received (step S101, YES), the signal generating unit generates a high frequency signal (step S102). The amplitude of reflection coefficient ρ of the cable assembly 30 is measured from the input wave from the signal generating unit 1 and the reflected wave from a side of the adapter 4 (step S103). The time-dependent variation of the amplitude of reflection coefficient ρ is recorded in the recording unit 5 (step S104). When the recording of the time-dependent variation is terminated, the generation of the high frequency signals is stopped (step S105).

If the time-dependent variation of the amplitude of reflection coefficient was measured twice is judged using a counter (not shown) (step S106). When the measurement was performed once (step S106, NO), the control is moved to the step S101 and the above-mentioned procedure is repeated.

When the measurement was performed twice (step S106, YES), the value of the counter, i.e., the number of times of measurement is cleared (step S107). The display processing unit 6 acquires data of the two time-dependent variations of the amplitude of reflection coefficient from the recording unit 5, superimposes the data, and outputs the result to the displaying unit 7, which displays the superimposed time-dependent variations (step S108). To enable the ranch points of the time-dependent variations of the two amplitude of reflection coefficients to be more easily observed visually, it is preferred that the time-dependent variations of the amplitude of reflection coefficient be processed in such a manner that they are displayed in different colors. Thereafter, the control unit C judges if instruction for termination was received from the input unit 8 (step S109). When no instruction for termination was received (step S109, NO), the control is moved to the step S101 and the above-mentioned procedure is repeated. When the instruction was received (step S109, YES), the procedure is terminated.

By this procedure, the time-dependent variations Lo1 and Ls1 of the amplitude of reflection coefficients are displayed in superposition to provide time t1 at the branch point P1 while the time-dependent variations Lo2 and Ls2 of the amplitude of reflection coefficients are displayed is superposition to provide time t2 of the branch point P1. Calculation of a half of a difference in time between t1 and t2 gives rise to a propagation delay time of the cable assembly 30.

Figure 8:
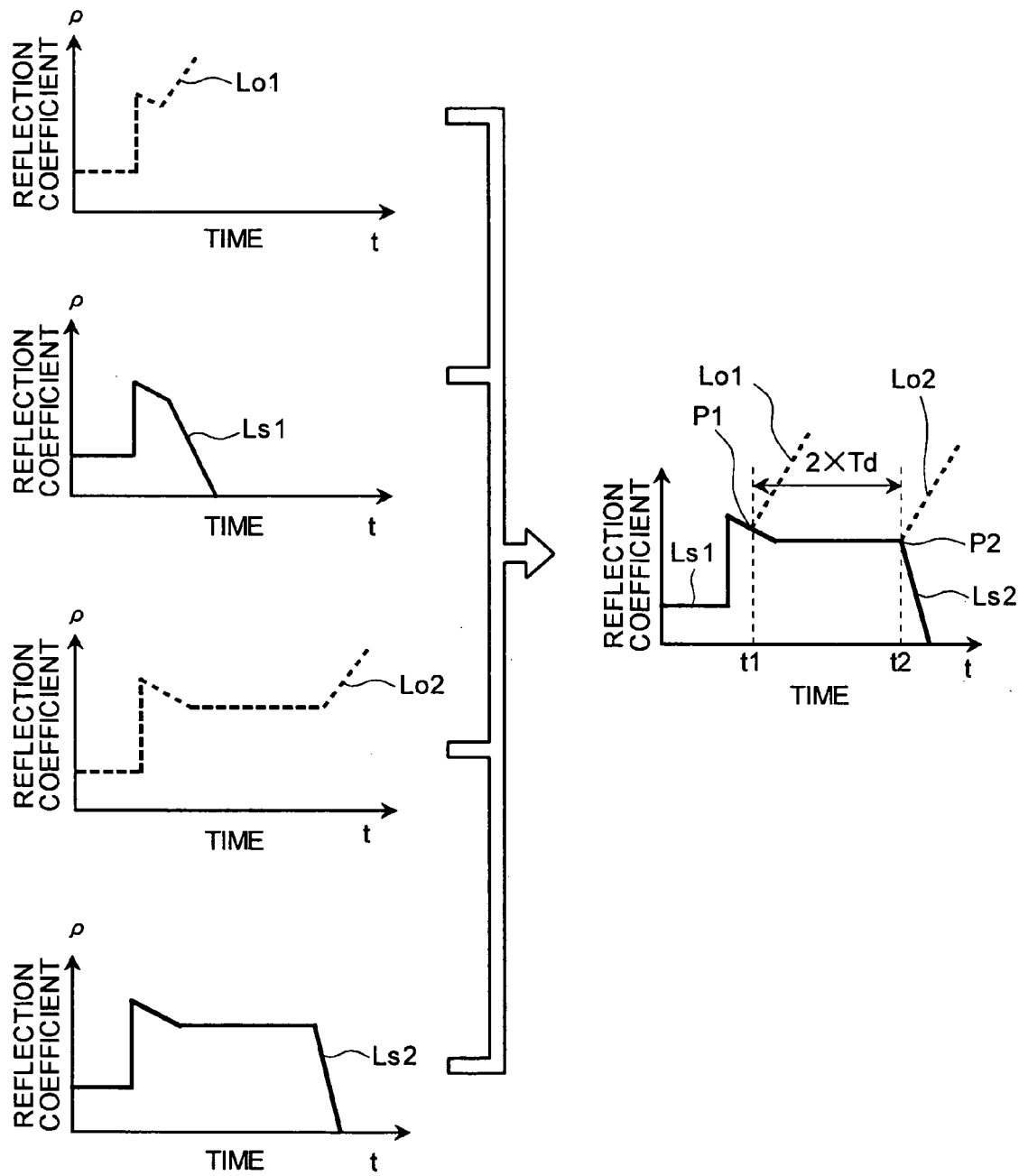
FIG. 8 is a schematic for explaining superposition of time-dependent variations of four variations of amplitude of reflection coefficients simultaneously.

In the present embodiment, the display in superposition of the time-dependent variations Lo1 and Ls1 and the display in superposition of the time-dependent variations Lo2 and Ls2 are performed separately. However, as shown in FIG. 8, all of the time-dependent variations Lo1, Ls1, Lo2, and Ls2 may be superposed and displayed in a display screen, and the time 1 and the time t2 at the branch points P1 and P2, respectively may be simultaneously obtained from the superposed display screen.

Figure 9:
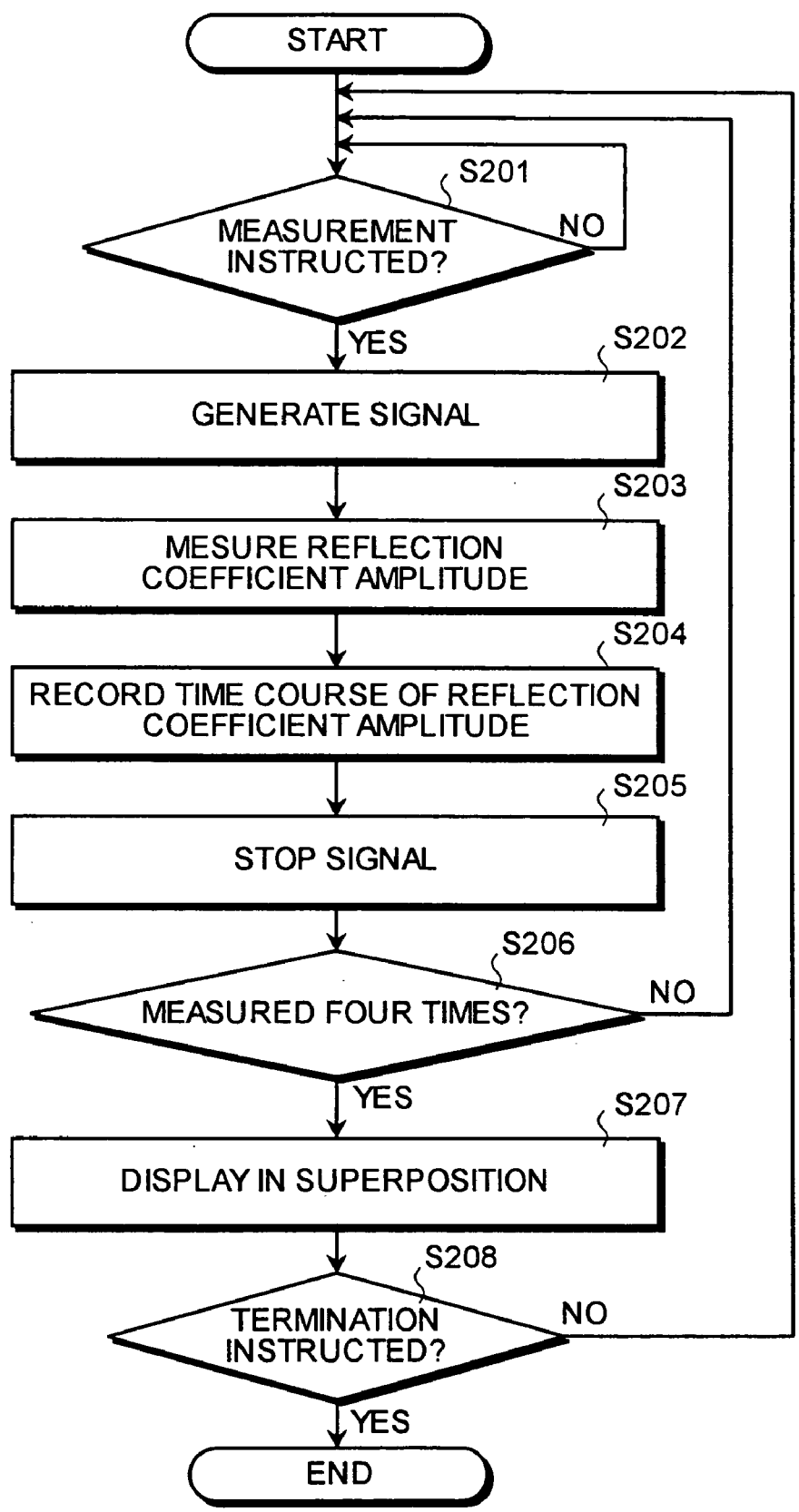
FIG. 9 is a flowchart of a procedure of measuring the propagation delay time of the cable assembly by the measuring apparatus according to a variation of the first embodiment.

Referring to FIG. 9, which is a flowchart of a procedure of measuring the propagation delay time of the cable assembly by the measuring apparatus according to the variation of the first embodiment, the procedure in the measuring apparatus when four time-dependent variations Lo1, Ls1, Lo2, and Ls2 of the amplitude of reflection coefficient are simultaneously displayed in superposition is explained.

In the same manner as in the steps S101 to S105, the time-dependent variation of an amplitude of reflection coefficient is measured and the result is recorded in the recording unit 5 (step S201 to S205). Then, the control unit C judges if the procedure was repeated four times (step S206). By repeating a series of procedure four times, data of four time-dependent variations Lo1, Ls1, Lo2, and Ls2 of the amplitude of reflection coefficient are recorded in the recording unit 5.

When the series of the procedure was not repeated four times (step S206, NO), the control is moved to the step S201 and the time-dependent variations of the amplitude of reflection coefficient are measured and the results are recorded. When the series of procedure was repeated four times (step S206, YES), the displaying processing unit 6 acquires the data from the recording unit 5 and processes the data in such a manner that all the four time-dependent variations Lo1, Ls1, Lo2, and Ls2 are superposed. The result is output to the displaying unit 7. The displaying unit 7 displays the time-dependent variations Lo1, Ls1, Lo2, and Ls2 in superposition on the display screen (step S207). From the superposed time-dependent variations, time t1 and time t2 at two branch points P1 and P2, respectively, are read and a half of a difference in time between t1 and t2 is calculated to obtain a propagation delay time Td of the cable assembly. Thereafter, the control unit C judges if instruction for termination of the procedure was received (step S208). When no instruction for terminating the procedure was received (step S208, NO), the control is moved to the step S201, and measurement of the propagation delay time of a next signal line or a signal line of other cable assemblies is repeated performed. When the instruction for terminating the procedure was received (step S208, YES), the procedure is terminated.

The results of the measurements of the propagation delay time of the cable assembly are explained. The same coaxial cable assembly was measured by two measurers A and B. One measurer A performed measurement by the method of measurement according to the above-mentioned embodiment and the other measurer B performed measurement by a conventional open method. The coaxial cable assembly has ten pins and measurement was performed for each signal line.

The results obtained by using the conventional open method are as shown in FIG. 10. When the conventional open method was used, the square mean value of the difference between the measured values obtained by the measurers A and B was 72 (ps/m). When the conventional short-circuit method was used, the square mean value of the difference between the measured values obtained by the measurers A and B was 80 (ps/m). On the contrary, the results of the measurement by the measuring method according to one embodiment of the present invention are as shown in FIG. 11. The square mean value of the difference between the measured values obtained by the measurers A and B was as 15 (ps/m). This indicates that use of the measuring method according to the present embodiment enables considerable reduction of deviations of measurement between the measurers.

Figure 12:
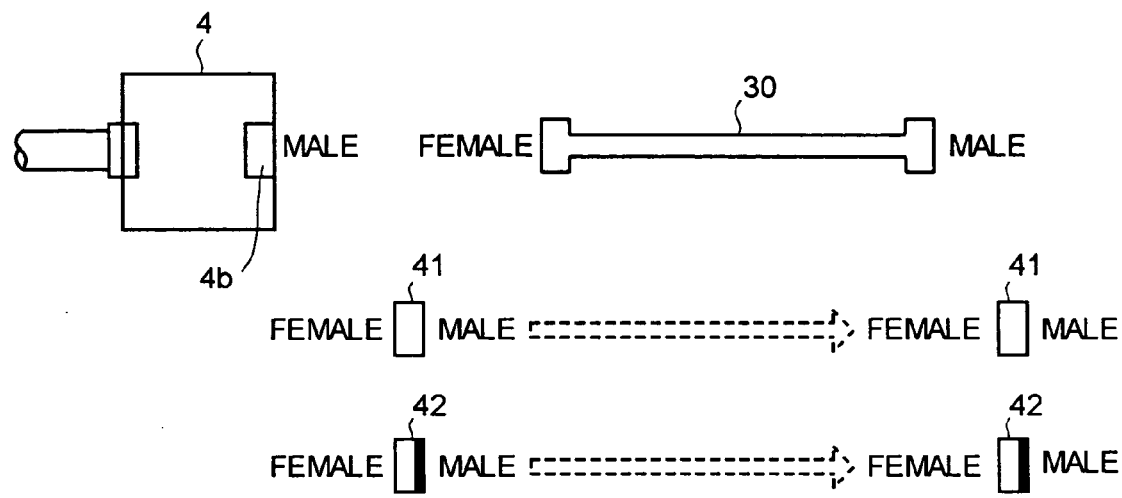
FIG. 12 is a schematic cross-section of an example of a connector used when connectors at both ends of a cable assembly have the same shape.

In the above-mentioned embodiments, which one of male or female shapes the ends of the cable assembly 30 have must be taken into consideration. As shown in FIG. 12, when the cable assembly 30 has a female shape at one end and a male shape at the other end, it is sufficient to provide two connectors 41 and 42 that correspond to the connector 21 and 22, respectively. In FIG. 12, the connector receptor of the conversion cable has a male shape. In this case, the propagation delay time of the two connectors 41 and 42 must be set at the same value. The connector 41 has open ends. One of the ends of the connector 41 has a female shape and the other has a male shape. The time-dependent variations Lo1 and Ls1 of the connectors 41 and 42 are determined by connecting the connectors 41 and 42 to the connector receptor 4b, respectively. The time-dependent variations Lo2 and Ls2 are determined by connecting the connectors 41 and 42 to the distal end of the cable assembly 30, respectively. As a result, by using only the two connectors 41 and 42, all the measurements can be performed without providing four connectors that have the same propagation delay time.

Figure 13:
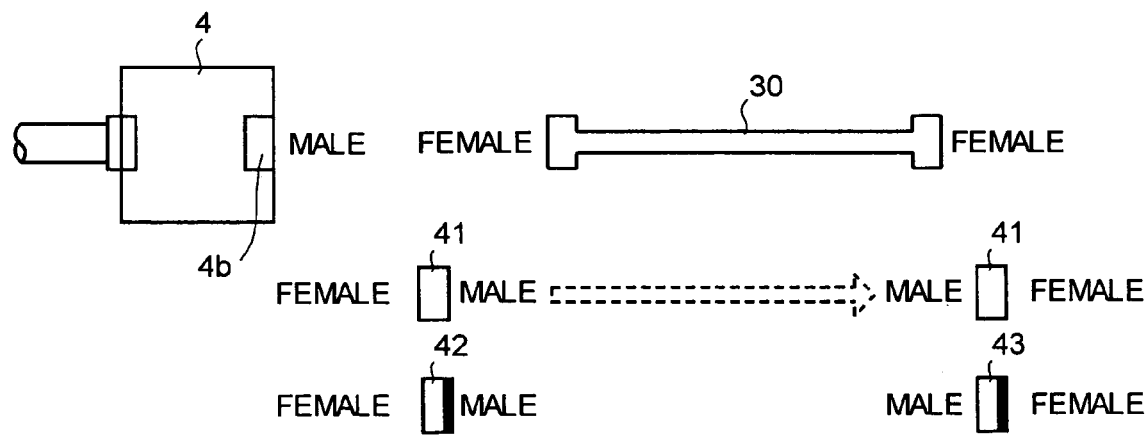
FIG. 13 is a schematic cross-section of an example of a connector used when connectors at both ends of a cable assembly have the same shape.

When the both ends of the cable assembly 30 are of the female shape as shown in FIG. 13, the connectors 41 and 42 can be used. However, the connector 42 can be used only when connected to the connector receptor 4b directly. To short-circuit the distal end of the cable assembly, it is necessary to provide a connector 43, one end of which has a female shape and is short-circuited and the other of which has a male shape and is open. In other words, it is necessary to provide the three connectors 41 to 43 and adjust the connectors 41 to 43 to have the same propagation delay time.

The cable assemblies 30 shown in FIG. 12 have ends of different shapes with respect to female or male shape. The cable assembly 30 shown in FIG. 13 has ends of the same shapes with respect to female or male shape. These have the same connector shapes. On the other hand, in the case of a cable assembly that has different connector shapes at the ends, measurement is performed by using a conversion connector that has both the shapes at the ends.

Figure 14:
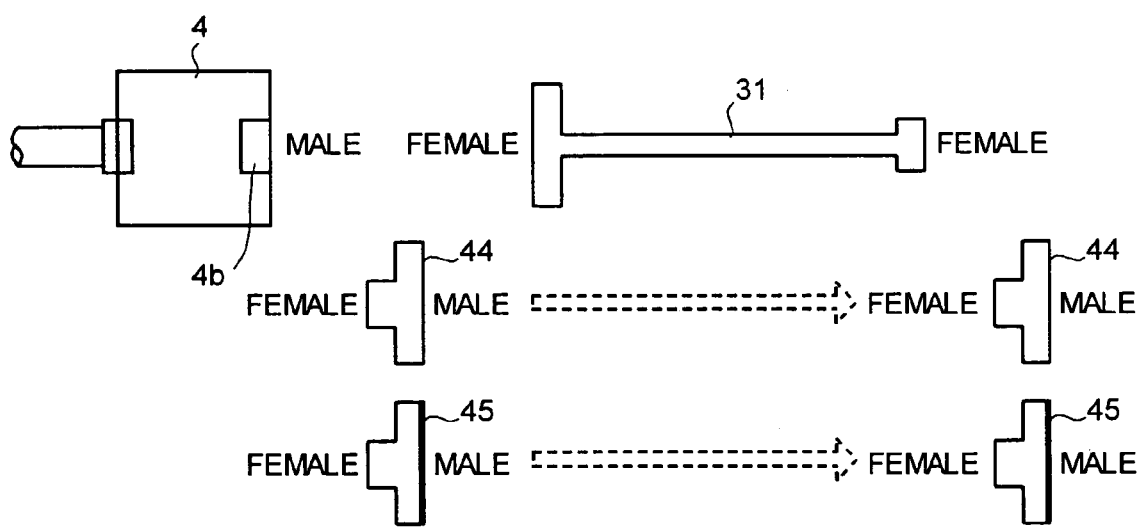
FIG. 14 is a schematic cross-section of an example of a connector used when connectors at both ends of a cable assembly have different shapes.

For example, assume that the propagation delay time of a cable assembly 31 that has a female shape and a connector shape different from that of the connector receptor 4b at one end and a male shape and the same connector shape as that of the connector receptor 4b as shown in FIG. 14 is measured. In this case, two connectors 44 and 45 are provided. The connector 44 has open ends, one of which has a female shape and a connector shape the same as that of the connector receptor 4b and the other of which has a male shape and a connector shape different from that of the connector receptor 4b. The connector 45 has a short-circuited end that has a male shape and a connector shape different from that of the connector receptor 4b and the other end of the connector 45 has a male shape and a connector shape the same as that of the connector receptor 4b. By using the connectors 44 and 45, the propagation delay time of the cable assembly 31 can be measured.

Measurement of the propagation delay time of a cable assembly 32 having different connector shapes at the ends can be realized also by providing a connector receptor 54 with two connector receptors 54a and 54b that correspond to the connector shapes at the ends of the cable assembly 32 as shown in FIG. 15.

For example, when both the ends of the cable assembly 32 have female shapes, a connector 51 that has a male shape corresponding to the connector receptor 54b at at least one end and an open end at the other end and a connector 52 that has a male shape corresponding to the connector receptor 54b at at least one end and is short-circuited at the other end can be provided. It is necessary to adjust the electric length of the conversion adapter 54 with an electroconductive pattern or a wire to make the connector receptors 54a and 54b have the same propagation delay time. In FIG. 15, the electric lengths of the connector receptors 54a and 54b are adjusted with wires L1 and L2, respectively.

When the propagation delay time of the cable assembly 32 is measured using the conversion adaptor 54, first the connectors 51 and 52 are connected to the connector receptor 54b in turn and the time-dependent variations of the amplitude of reflection coefficient Lo1 and Ls1 are measured. Thereafter, one end of the cable assembly 32 is connected to the connector receptor 54a and the connector 51 and 52 are connected to the other end of the cable assembly 32 in turn to measure the time-dependent variations Lo2 and Ls2, respectively.

The short-circuiting of a plurality of pins of the connector can be performed with, for example, a short-circuiting pin.

According to the first embodiment, connectors that have the same propagation delay time are used and the time-dependent variations Lo1 and Ls1 of the connectors themselves in open and short-circuited states, respectively, are measured. The results are displayed in superposition and the time t1 at the branch point P1 is read. Then, the cable assembly with open or short-circuited connector connected to the distal end is connected and the time-dependent variations Lo2 and Ls2 of the cable assembly with the connector are measured. The results are displayed in superposition and the time t2 at the branch point P2 is read. A half of difference in time, t2-t1 is obtained as a propagation delay time. Accordingly, the measurer can read the branch points P1 and P2 with ease. This minimizes deviation in reading among the measurers, so that the propagation delay time of the cable assembly itself can be obtained objectively and with a high precision.

According to the first embodiment, the measurer visually reads the times t1 and t2 at the branch points P1 and P2, respectively, on the display screen. However, according to a second embodiment of the present invention, the times t1 and t2 at the branch points P1 and P2, respectively, or a difference between t1 and t2 can be obtained only by pointing the branch points P1 and P2.

Figure 16:
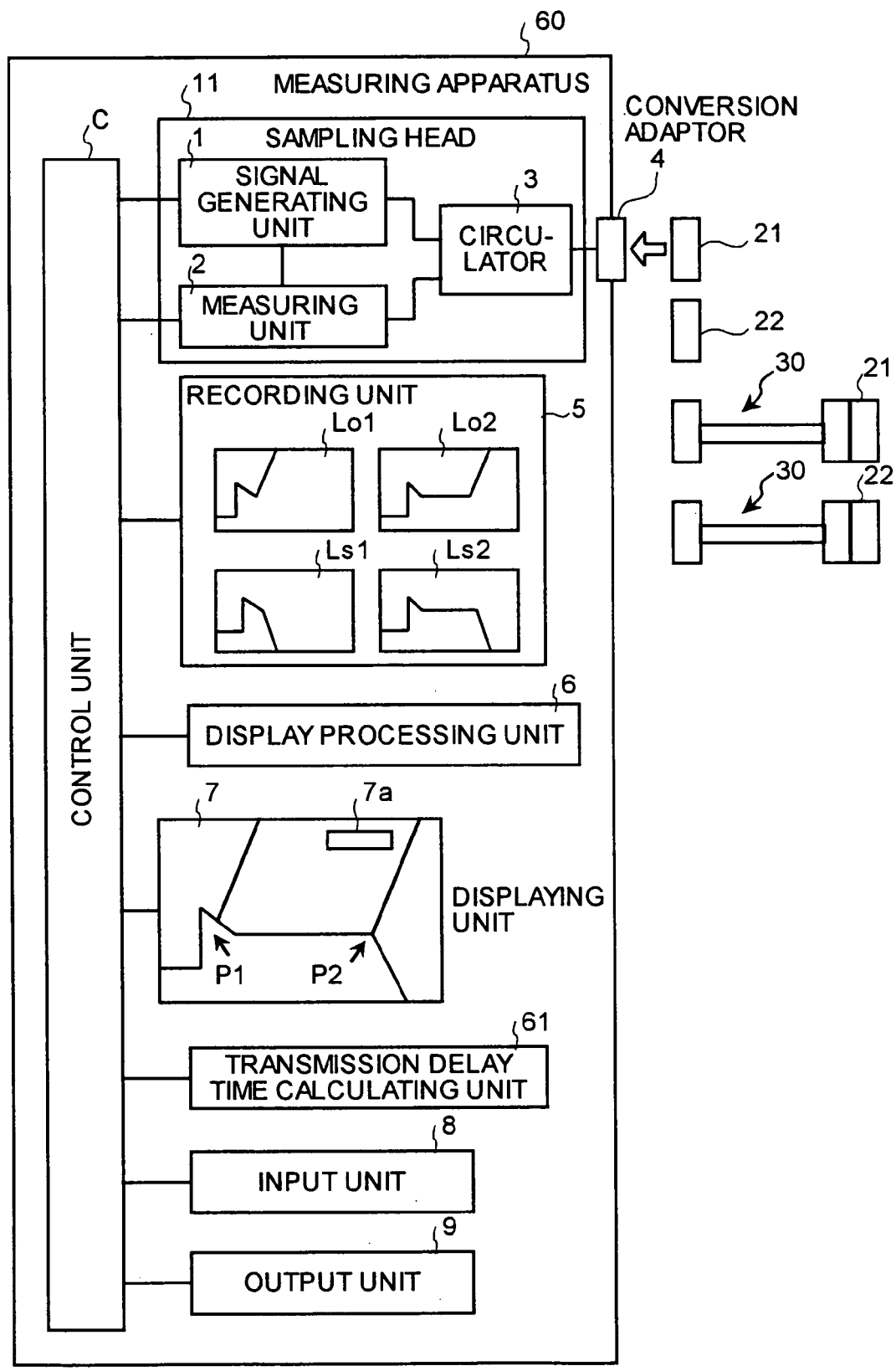
FIG. 16 is block diagram of a measuring apparatus according to a second embodiment of the present invention.

FIG. 16 is a block diagram of the measuring apparatus according to the second embodiment. A measuring apparatus 60 includes a propagation-delay-time calculating unit 61 in addition to the configuration of the measuring apparatus 10 shown in FIG. 1. The other configurations are the same as those of the measuring apparatus 10 and the same parts or components are indicated by the same reference numerals.

When the time-dependent variations of the amplitude of reflection coefficient are displayed in superposition on the displaying unit 7 and the branch points P1 and P2 are pointed by, for example, a pointer, the propagation-delay-time calculating unit 61 obtains time t1 and t2 that correspond to the positions pointed, and obtains a half of the difference in time between t1 and t2 as a propagation delay time Td. The obtained propagation delay time Td is displayed in a display region 7a of the displaying unit 7.

Figure 17:
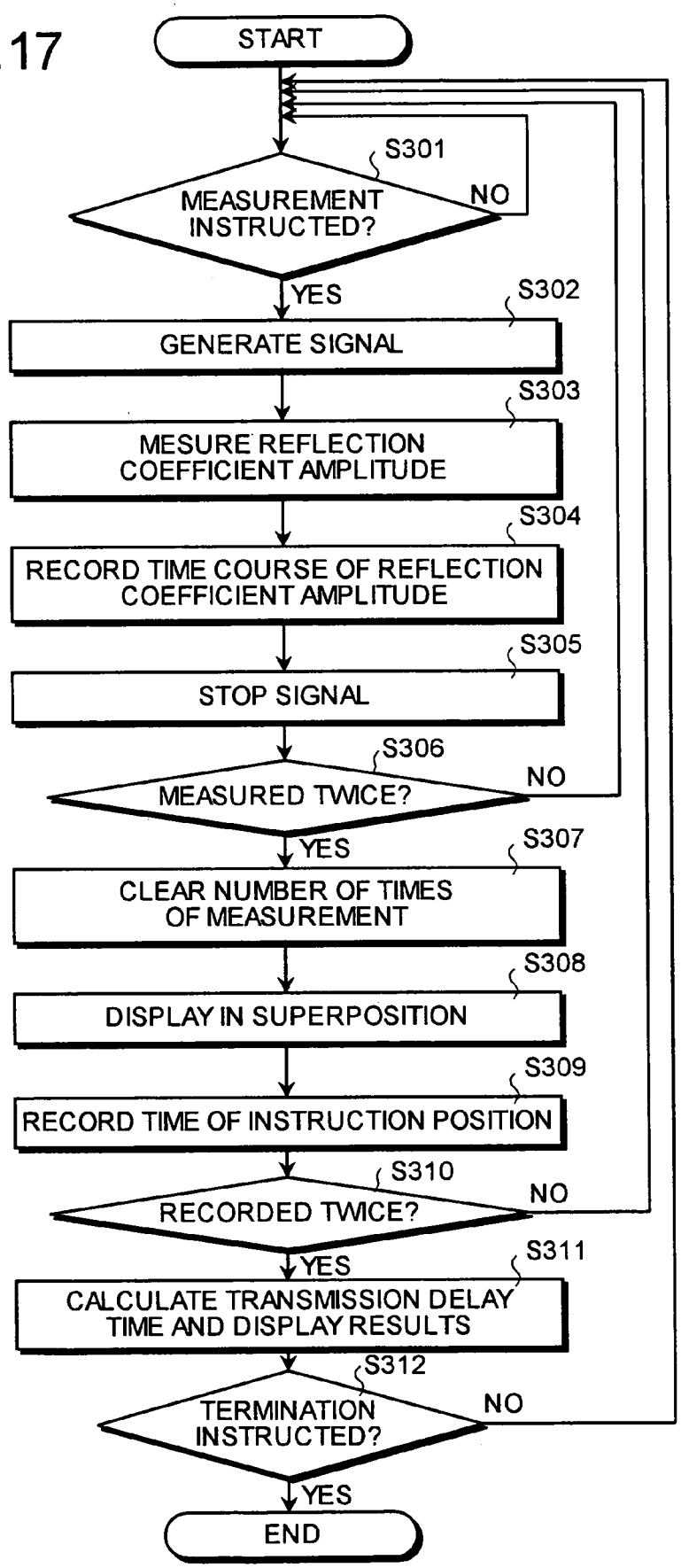
FIG. 17 is a flowchart of a procedure of measuring a propagation delay time of a cable assembly by the measuring apparatus according to the second embodiment.

Referring to the flowchart shown in FIG. 17, the procedure of measurement using the measuring apparatus of this embodiment is explained. First, in the same manner as at the steps S101 to S105, a time-dependent variation of the amplitude of reflection coefficient is measured and recorded in the recording unit 5 (step S301 to S305). The control unit C judges if this procedure was repeated twice (step S306).

When the procedure was performed only once (step S306, NO), the control is moved to the step S301 and the procedure is repeated. When the procedure was repeated twice (step S306, YES), the number of measurements of the counter is cleared (step S307). The displaying processing unit 6 processes the two time-dependent variations Lo1 and Ls1 to superpose the data and outputs the results to the displaying unit 7 (step S308). The measurer recognizes the branch point P1 on the display screen and inputs a command to move the pointer to the branch point P1 through the input unit 8 and settle the instruction. This results in recording of the time t1 at the branch point P1 in the recording unit 5 (step S309).

If the time at the branch point was recorded twice is judged (step S310). When the time was not recorded twice (step S310, NO), the control is moved to the step S301 and the procedure is repeated to record the time t2 at the branch point P2 in the recording unit 5.

When the time at the branch point was recorded twice (step S310, YES), a half of the difference between the times t1 and t2 recorded in the recording unit 5 is obtained and output to the display region 7a of the displaying unit 7 as the propagation delay time Td (step S311). Then, if instruction for termination was received was judged (step S312). When no instruction for termination was received (step S312, NO), measurement of the propagation delay time of the next signal line or other cable assembly is subsequently performed. When the instruction for termination was received (step S312, YES), the process is terminated.

When all of the four time-dependent variations Lo1, Ls1, Lo2, and Ls2 are displayed in superposition, two branch points P1 and P2 are pointed by the pointer to obtain a propagation delay time and output to the displaying unit 7.

According to the second embodiment, the propagation delay time can be automatically obtained only by pointing the branch points P1 and P2 on the display screen. Accordingly, measurement of propagation delay time can be performed more easily, objectively and with a high precision.

According to a third embodiment of the present invention, the branch points P1 and P2 are automatically obtained and propagation delay times are automatically obtained and displayed on the displaying unit 7.

Figure 18:
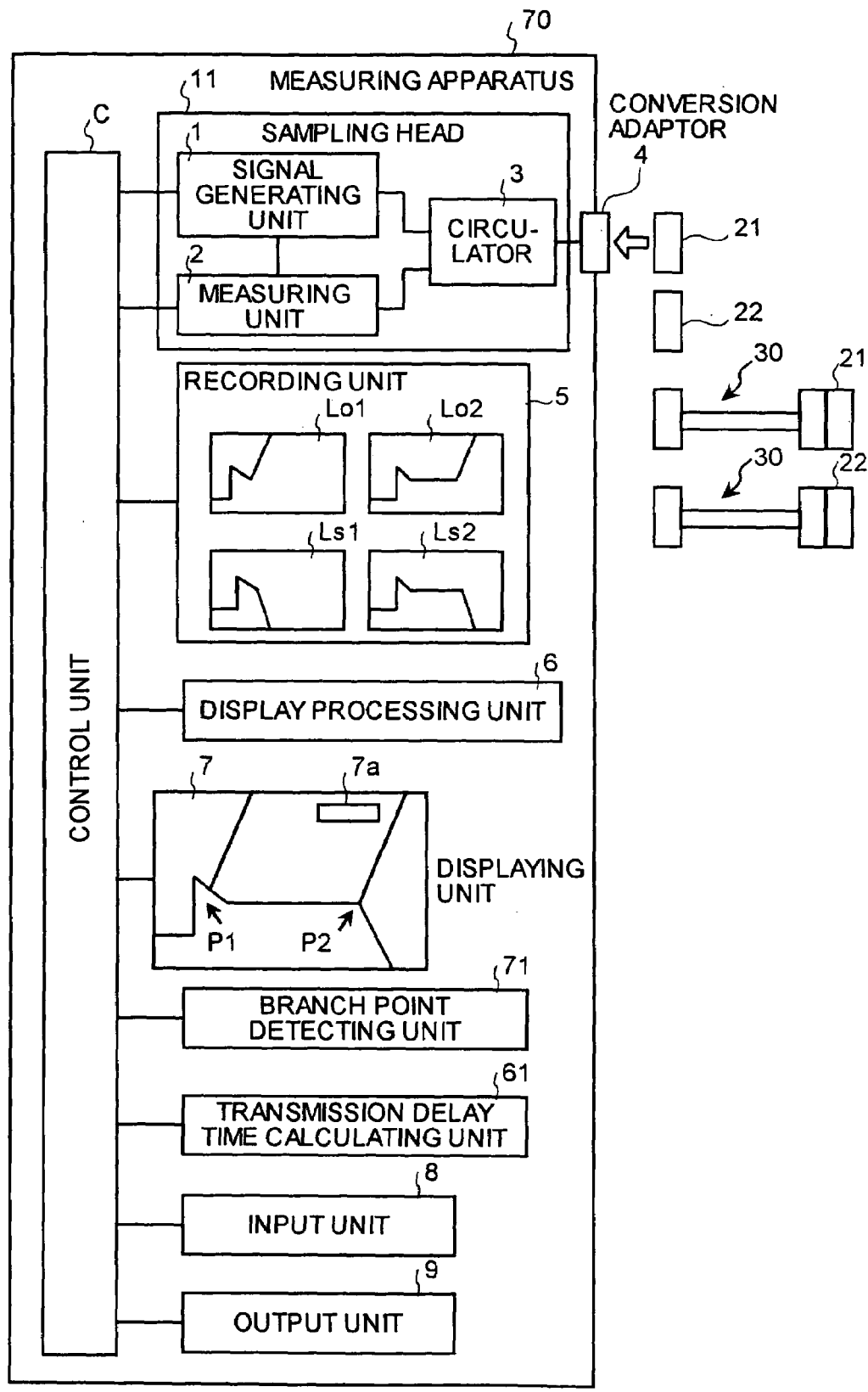
FIG. 18 is block diagram of a measuring apparatus according to a third embodiment of the present invention.

FIG. 18 is a block diagram of the measuring apparatus according to the third embodiment. A measuring unit 70 includes a branch point detecting unit 71 in addition to the configuration of the measuring apparatus 60. Other configurations are the same as those of the measuring apparatus 60 shown in FIG. 16. The same parts or components are designated by the same reference numerals.

The branch point detecting unit 71 performs calculations for obtaining the two time-dependent variations of the amplitude of reflection coefficient at the branch points P1 and P2, respectively. The positions of the obtained branch position P1 and P2 are input to the propagation-delay-time calculating unit 61, which obtains the time t1 and t2 at the branch points P1 and P2, respectively, and a half of the difference between the times t1 and t2 as a propagation delay time Td. The propagation-delay-time calculating unit 61 outputs the results to the displaying unit 7. The displaying unit 7 displays the obtained propagation delay time Td in the display region 7a.

Figure 19:
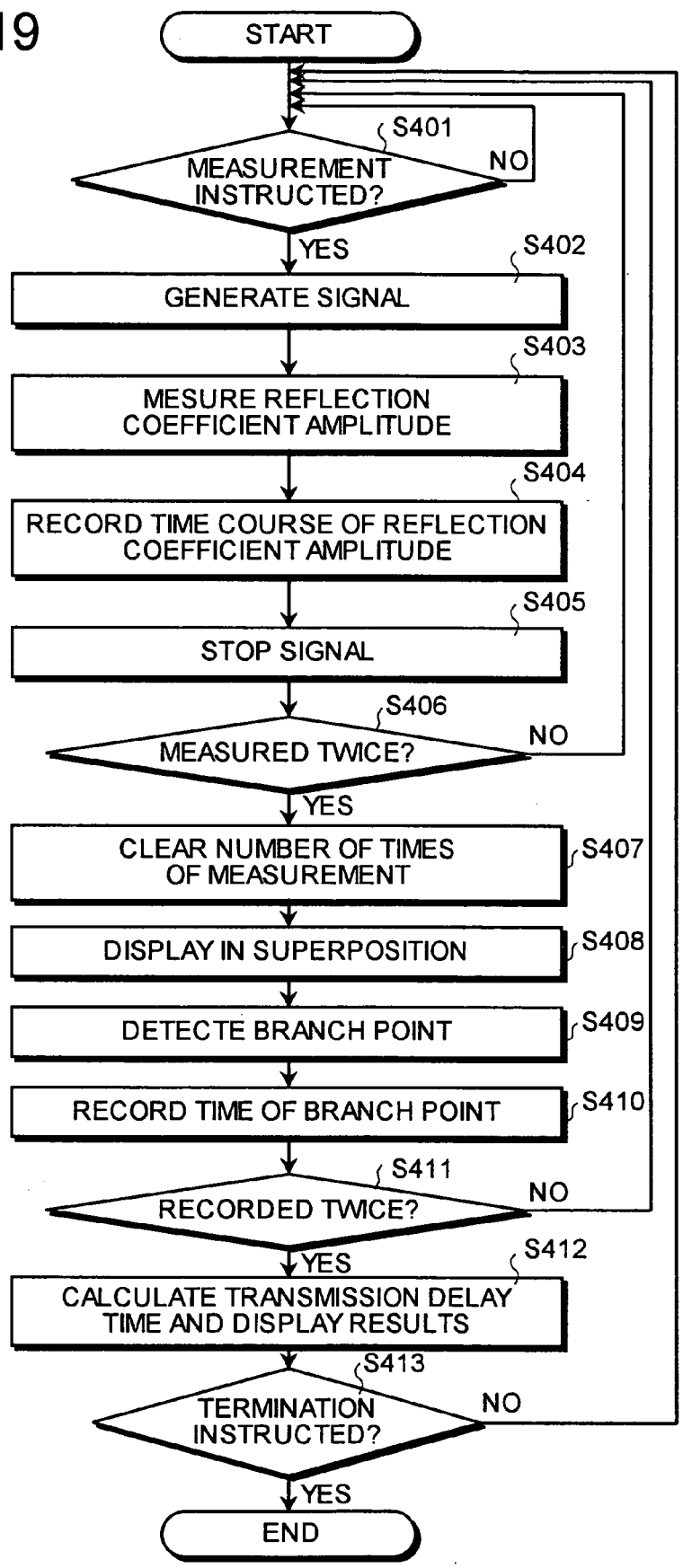
FIG. 19 is a flowchart of a procedure of measuring a propagation delay time of a cable assembly by the measuring apparatus according to the third embodiment.
Figure 20:
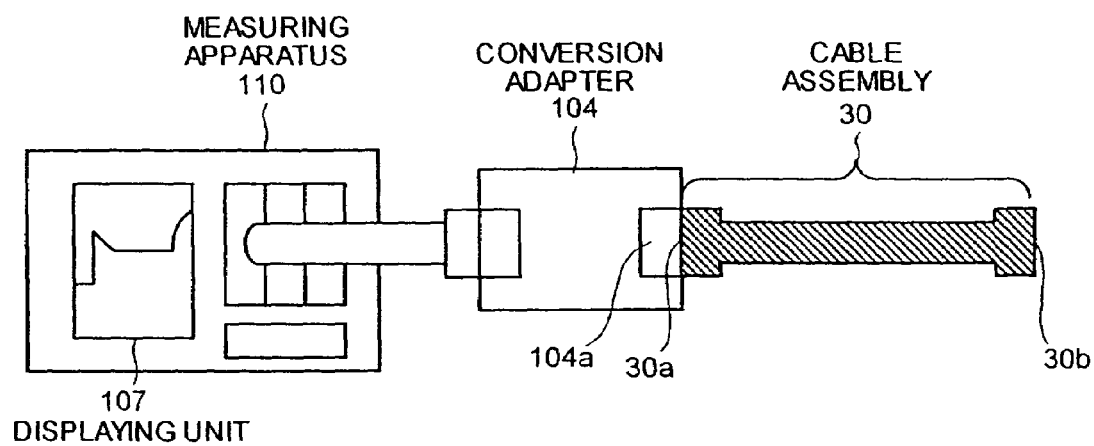
FIG. 20 is a schematic cross-section for explaining a state of connection between a measuring apparatus and a cable assembly by a conventional open method.
Figure 21:
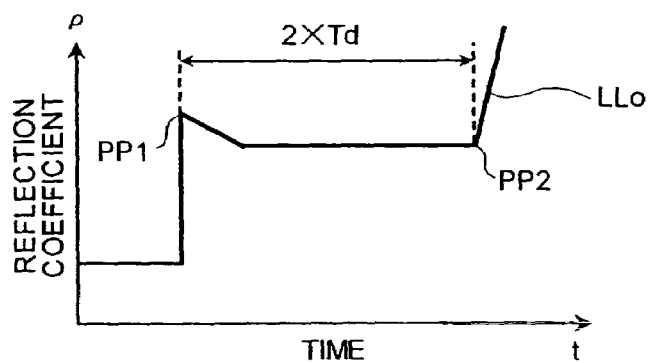
FIG. 21 is a graph of time-dependent variation of the amplitude of reflection coefficient obtained by the conventional open method.
Figure 22:
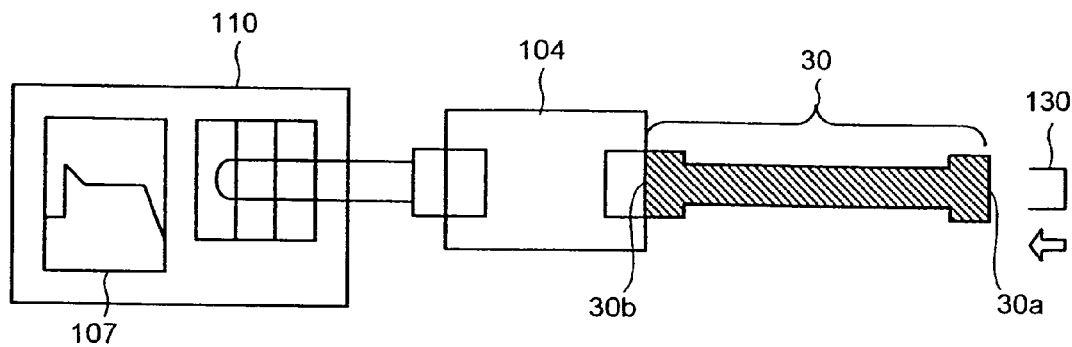
FIG. 22 is a schematic cross-section for explaining a state of connection between a measuring apparatus and a cable assembly by a conventional short-circuit method.
Figure 23:
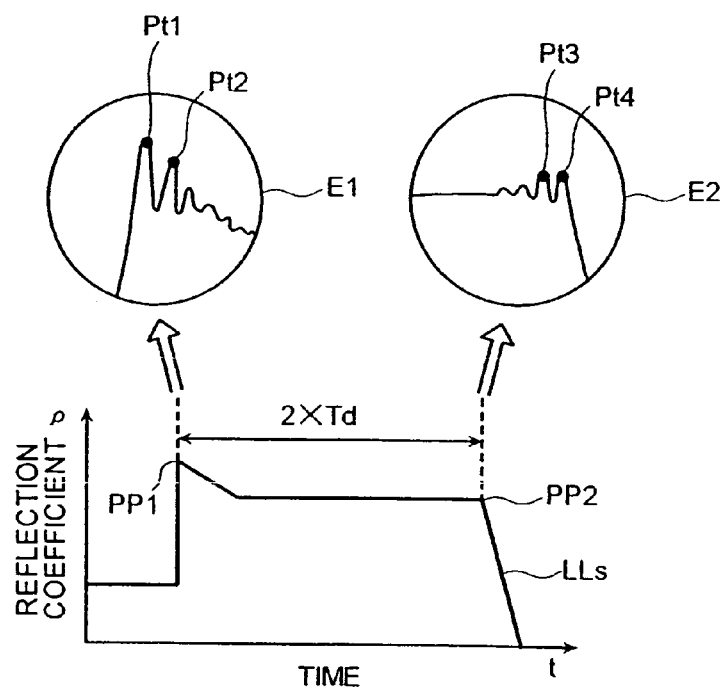
FIG. 23 is a schematic for explaining time-dependent variation of the amplitude of reflection coefficient obtained by the conventional short-circuit method.

Referring to the flowchart shown in FIG. 19, the procedure of measurement by the measuring apparatus according to the third embodiment is explained. First, in the same manner as at the steps S301 to S305, the time-dependent variation of the amplitude of reflection coefficient are measured and recorded in the recording unit 5 (step S401 to S405). The control unit C judges if this procedure was repeated twice (step S406).

When the procedure was performed only once (step S406, NO), the control is moved to the step S401 and the procedure is repeated. When the procedure was repeated twice (step S406, YES), the number of measurements of the counter is cleared (step S407). The displaying processing unit 6 processes the two time-dependent variations Lo1 and Ls1 to superpose the data and outputs the results to the displaying unit 7 (step S408). The branch point detecting unit 71 performs calculation of the position of the branch point P1 of the two superposed time-dependent variations Lo1 and Ls1 of the amplitude of reflection coefficient (step S409). The results are output to the recording unit 5 and recorded therein (step S410).

If the time at the branch point was recorded twice is judged (step S411). When the time was not recorded twice (step S411, NO), the control is moved to the step S401 and the procedure is repeated the position of the branch point P2 is recorded in the recording unit 5.

When the time at the branch point was recorded twice (step S411, YES), a half of the difference between the times t1 and t2 corresponding to the positions recorded in the recording unit 5 are obtained. A half of the difference in time is obtained and output to the displaying unit 7 as the propagation delay time. The displaying unit 7a display the propagation delay time Td in the display region 7a (step S412). Thereafter, if instruction for termination was received was judged (step S413). When no instruction for termination was received (step S413, NO), measurement of the propagation delay time of the next signal line or other cable assembly is subsequently performed. When the instruction for termination was received (step S413, YES), the process is terminated.

The positions of the branch points P1 and P2 may be obtained simultaneously after all of the four time-dependent variations Lo1, Ls1, Lo2, and Ls2 are obtained.

The displaying processing unit 6 need not output two or four time-dependent variations to the displaying unit 7 (step S408).

According to the third embodiment, the positions of the branch points P1 and P2 on the display screen are automatically calculated. Based on the time t1 and t2 that correspond to the calculated positions of the branch points P1 and P2, respectively, the propagation delay time can be obtained automatically. Accordingly, measurement of the propagation delay time can be performed more easily, objectively and with a high precision.

The cable assemblies to be measured that are explained in the first to third embodiments are used for high speed parallel transmission or high speed serial transmission of several 100 megabits per second (Mbps) to several 10 gigabits per second (Gbps). The transmission method of the cable assemblies may be either unbalanced transmission or balanced transmission. The cable assemblies may be those for various transmission systems, for example, a Texas mathematics diagnostic system (TMDS), a laurel virtual serial driver system (LVDS), and a gigabit video interface (GVIF).

According to the first to the third embodiments, the data are input to the displaying unit 7 and displayed. However, the data may be output by the output unit 9 as a print.

The components of the measuring apparatus shown in each Figure are depicted for explaining their functions and the components need not be physically configured as depicted. That is, specific embodiments of dispersed and integration of each apparatus are not limited to those shown in the drawings. However, all or a part of the components of the apparatus may be configured dispersed or integrated functionally or physically in any unit depending on various loads and states of use.

All or a part of various processing functions performed in each apparatus can be realized by a central processing unit (CPU) (not shown) that corresponds to the control unit C and a computer program that is analyzed and executed by the CPU, or as a hardware by a wired logic.

The measurement processing function of the measuring apparatus or measuring method according to the first to the third embodiment can be realized by software using a computer program for processing the measurement.

The method of measuring the electric characteristics according to the embodiments can be realized b executing a computer program that is provided in advance in a computer such as a personal computer or a workstation. The control unit C can be realized by a central processing unit (CPU) and a random access memory (RAM) (not shown). The above-mentioned computer program and the like are stored in the RAM and executed by the CPU.

The computer program can be distributed through a network such as the Internet. The computer program may be recorded in a computer readable recording medium such as a hard disk, a flexible disk (FD), a compact disk-read only memory (CD-ROM), a magneto-optical (MO) drive, and a digital versatile disk (DVD). The computer reads the computer program from the recording medium and executes therein.

As described above, according to the present invention, a half of a difference between the time at a branch point obtained when the time-dependent variation of the first connector that has an open end and the time-dependent variation of the second connector that has a short-circuited are superposed and the time at a branch point obtained when the time-dependent variation of the cable assembly with the first connector connected to the distal end and the time-dependent variation of the cable assembly are superposed is obtained as a propagation delay time of the cable assembly. Accordingly, the branch points can be visually recognized clearly and deviation of measurements by the measures can be minimized, so that measurement of the propagation delay time of the cable assembly can be performed with a high precision.

Furthermore, according to the present invention, the propagation delay time can be calculated by pointing the branch points on the display screen by the branch-point indicating unit. Accordingly, the load on the measurer can be reduced and deviations in measurement can be reduced.

Moreover, according to the present invention, the time dependent variations of the amplitude of reflection coefficient that are superposed are displayed in different colors. Accordingly, the visual recognition of the branch points can be made more easily. This reduces the deviations of measurement by the measures.

Furthermore, according to the present invention, the branch points obtained by superposing two time-dependent variations of the reflection coefficient of amplitude are automatically detected and the propagation delay time is calculated based on the detected branch points. Accordingly, deviations of measurement by the measurers can be avoided.

When the cable assembly has different connector shapes from each other, the first connector and the second connector may be configured as conversion connectors that have connector shapes matching those of the respective ends of the cable assembly, or a plurality of connector receptors that allows connection of connectors having different connector shapes are provided in the connector. Accordingly, even when the connector shapes of the ends of the cable assembly are different each other, the propagation delay time can be measured with high workability.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An apparatus for measuring electric characteristics of a cable assembly that is connected to the apparatus via a connecting unit, by outputting a predetermined frequency signal to the cable assembly, measuring an amplitude of reflection coefficient of the predetermined frequency signal, and calculating a propagation delay time of the cable assembly based on a time-dependent variation of the amplitude of reflection coefficient, the apparatus comprising:

a reflection-coefficient measuring unit that measures the time-dependent variation of the amplitude of reflection coefficient in each of connection states including
a first connection state in which a first connector with both terminals open-circuited is connected to the connecting unit;

a second connection state in which one terminal of a second connector with other terminal short-circuited, having same propagation delay time as that of the first connector, is connected to the connecting unit;

a third connection state in which one terminal of the cable assembly is connected to the connecting unit, and other terminal of the cable assembly is connected to the first connector; and a fourth connection state in which one terminal of the cable assembly is connected to the connecting unit, and other terminal of the cable assembly is connected to the second connector; and an output processing unit that visually outputs a superposition of the time-dependent variations of the amplitude of reflection coefficient in the first and the second connection states or a superposition of the time-dependent variations of the amplitude of reflection coefficient in the third and the fourth connection states; wherein a half of a time difference between a branch point of the time-dependent variations of the amplitude of reflection coefficient in the first and the second connection states and a branch point of the time-dependent variations of the amplitude of reflection coefficient in the third and the fourth connection states is obtained as the propagation delay time.

2. The apparatus according to claim 1, wherein the output processing unit visually outputs a superposition of the time-dependent variations of the amplitude of reflection coefficient in the first to the fourth connection states.

3. The apparatus according to claim 1, further comprising:
a branch-point indicating unit that indicates two of the branch points on a display on which the time-dependent variations of the amplitude of reflection coefficient are output; and a propagation-delay-time calculating unit that calculates a time difference between the branch points indicated by the branch-point indicating unit, and outputs a half of the time difference as the propagation delay time.

4. The apparatus according to claim 1, wherein the output processing unit visually outputs the time-dependent variations of the amplitude of reflection coefficient in the first and the second connection states in different colors, visually outputs the time-dependent variations of the amplitude of reflection coefficient in the third and the fourth connection states in different colors, or visually outputs the time-dependent variations of the amplitude of reflection coefficient in the first to the fourth connection states in different colors.

5. The apparatus according to claim 1, wherein
the cable assembly includes one terminal and other terminal with different connector shapes, and
the first connector and the second connector are conversion connectors having connector shapes that match the connector shapes of the one terminal and the other terminal of the cable assembly, respectively.

6. The apparatus according to claim 1, wherein the connecting unit includes a plurality of connector receptors capable of connecting connectors with different connector shapes.

7. An apparatus for measuring electric characteristics of a cable assembly that is connected to the apparatus via a connecting unit, by outputting a predetermined frequency signal to the cable assembly, measuring an amplitude of reflection coefficient of the predetermined frequency signal, and calculating a propagation delay time of the cable assembly based on a time-dependent variation of the amplitude of reflection coefficient, the apparatus comprising:

a reflection-coefficient measuring unit that measures the time-dependent variation of the amplitude of reflection coefficient in each of connection states including a first connection state in which a first connector with both terminals open-circuited is connected to the connecting unit;

a second connection state in which one terminal of a second connector with other terminal short-circuited, having same propagation delay time as that of the first connector, is connected to the connecting unit;

a third connection state in which one terminal of the cable assembly is connected to the connecting unit, and other terminal of the cable assembly is connected to the first connector; and a fourth connection state in which one terminal of the cable assembly is connected to the connecting unit, and other terminal of the cable assembly is connected to the second connector; and a time-difference calculating unit that obtains a first branch point in a superposition of the time-dependent variations of the amplitude of reflection coefficient in the first and the second connection states and a second branch point in a superposition of the time-dependent variations of the amplitude of reflection coefficient in the third and the fourth connection states, calculates a time difference between the first branch point and the second branch point, and outputs a half of the time difference as the propagation delay time.

8. The apparatus according to claim 7, wherein
the cable assembly includes one terminal and other terminal with different connector shapes, and
the first connector and the second connector are conversion connectors having connector shapes that match the connector shapes of the one terminal and the other terminal of the cable assembly, respectively.

9. The apparatus according to claim 7, wherein the connecting unit includes a plurality of connector receptors capable of connecting connectors with different connector shapes.

10. A computer-readable recording medium that stores a computer program for measuring electric characteristics of a cable assembly that is connected via a connecting unit, by outputting a predetermined frequency signal to the cable assembly, measuring an amplitude of reflection coefficient of the predetermined frequency signal, and calculating a propagation delay time of the cable assembly based on a time-dependent variation of the amplitude of reflection coefficient, wherein the computer program makes a computer execute a first measurement processing including measuring the time-dependent variation of the amplitude of reflection coefficient in a first connection state in which a first connector with both terminals open-circuited is connected to the connecting unit and a second connection state in which one terminal of a second connector with other terminal short-circuited, having same propagation delay time as that of the first connector, is connected to the connecting unit;

a first output processing including outputting visually a superposition of the time-dependent variations of the amplitude of reflection coefficient measured at the first measurement processing;

a second measurement processing including measuring the time-dependent variation of the amplitude of reflection coefficient in a third connection state in which one terminal of the cable assembly is connected to the connecting unit, and other terminal of the cable assembly is connected to the first connector and a fourth connection state in which one terminal of the cable assembly is connected to the connecting unit, and other terminal of the cable assembly is connected to the second connector; and a second output processing including outputting visually a superposition of the time-dependent variations of the amplitude of reflection coefficient measured at the second measurement processing.

11. The computer-readable recording medium according to claim 10, wherein the computer program further makes the computer execute a time-difference calculating including
obtaining a first branch point of the time-dependent variations of the amplitude of reflection coefficient in the first and the second connection states and a second branch point of the time-dependent variations of the amplitude of reflection coefficient in the third and the fourth connection states indicated on a display on which the time-dependent variations of the amplitude of reflection coefficient are output;
calculating a time difference between the first branch point and the second branch point; and
outputting a half of the time difference as the propagation delay time.

12. The computer-readable recording medium according to claim 10, wherein the first output processing and the second output processing include outputting visually the time-dependent variations of the amplitude of reflection coefficient in the first and the second connection states in different colors, outputting visually the time-dependent variations of the amplitude of reflection coefficient in the third and the fourth connection states in different colors, or outputting visually the time-dependent variations of the amplitude of reflection coefficient in the first to the fourth connection states in different colors.

13. The computer-readable recording medium according to claim 10, wherein the computer program further makes the computer to execute
detecting a first branch point of the time-dependent variations of the amplitude of reflection coefficient in the first and the second connection states, and a second branch point of the time-dependent variations of the amplitude of reflection coefficient in the third and the fourth connection states; and
calculating a half of a time difference between the first branch point and the second branch point as the propagation delay time.

14. A computer-readable recording medium that stores a computer program for measuring electric characteristics of a cable assembly that is connected via a connecting unit, by outputting a predetermined frequency signal to the cable assembly, measuring an amplitude of reflection coefficient of the predetermined frequency signal, and calculating a propagation delay time of the cable assembly based on a time-dependent variation of the amplitude of reflection coefficient, wherein the computer program makes a computer execute
measuring the time-dependent variation of the amplitude of reflection coefficient in a first connection state in which a first connector with both terminals open-circuited is connected to the connecting unit, a second connection state in which one terminal of a second connector with other terminal short-circuited, having same propagation delay time as that of the first connector, is connected to the connecting unit, a third connection state in which one terminal of the cable assembly is connected to the connecting unit, and other terminal of the cable assembly is connected to the first connector, and a fourth connection state in which one terminal of the cable assembly is connected to the connecting unit, and other terminal of the cable assembly is connected to the second connector; and
outputting visually a superposition of the time-dependent variations of the amplitude of reflection coefficient measured at the measuring.

15. The computer-readable recording medium according to claim 14, wherein the computer program further makes the computer execute a time-difference calculating including
obtaining a first branch point of the time-dependent variations of the amplitude of reflection coefficient in the first and the second connection states and a second branch point of the time-dependent variations of the amplitude of reflection coefficient in the third and the fourth connection states indicated on a display on which the time-dependent variations of the amplitude of reflection coefficient are output;
calculating a time difference between the first branch point and the second branch point; and
outputting a half of the time difference as the propagation delay time.

16. The computer-readable recording medium according to claim 14, wherein the first output processing and the second output processing include outputting visually the time-dependent variations of the amplitude of reflection coefficient in the first and the second connection states in different colors, outputting visually the time-dependent variations of the amplitude of reflection coefficient in the third and the fourth connection states in different colors, or outputting visually the time-dependent variations of the amplitude of reflection coefficient in the first to the fourth connection states in different colors.

17. The computer-readable recording medium according to claim 14, wherein the computer program further makes the computer to execute
detecting a first branch point of the time-dependent variations of the amplitude of reflection coefficient in the first and the second connection states, and a second branch point of the time-dependent variations of the amplitude of reflection coefficient in the third and the fourth connection states; and
calculating a half of a time difference between the first branch point and the second branch point as the propagation delay time.

18. A computer-readable recording medium that stores a computer program for measuring electric characteristics of a cable assembly that is connected via a connecting unit, by outputting a predetermined frequency signal to the cable assembly, measuring an amplitude of reflection coefficient of the predetermined frequency signal, and calculating a propagation delay time of the cable assembly based on a time-dependent variation of the amplitude of reflection coefficient, wherein the computer program makes a computer execute
measuring the time-dependent variation of the amplitude of reflection coefficient in a first connection state in which a first connector with both terminals open-circuited is connected to the connecting unit, a second connection state in which one terminal of a second connector with other terminal short-circuited, having same propagation delay time as that of the first connector, is connected to the connecting unit, a third connection state in which one terminal of the cable assembly is connected to the connecting unit, and other terminal of the cable assembly is connected to the first connector, and a fourth connection state in which one terminal of the cable assembly is connected to the connecting unit, and other terminal of the cable assembly is connected to the second connector;

detecting a first branch point of the time-dependent variations of the amplitude of reflection coefficient in the first and the second connection states, and a second branch point of the time-dependent variations of the amplitude of reflection coefficient in the third and the fourth connection states; and calculating a half of a time difference between the first branch point and the second branch point as the propagation delay time.

19. A method of measuring electric characteristics of a cable assembly that is connected via a connecting unit, by outputting a predetermined frequency signal to the cable assembly, measuring an amplitude of reflection coefficient of the predetermined frequency signal, and calculating a propagation delay time of the cable assembly based on a time-dependent variation of the amplitude of reflection coefficient, the method comprising:

a first measurement processing including measuring the time-dependent variation of the amplitude of reflection coefficient in a first connection state in which a first connector with both terminals open-circuited is connected to the connecting unit and a second connection state in which one terminal of a second connector with other terminal short-circuited, having same propagation delay time as that of the first connector, is connected to the connecting unit;

a first output processing including outputting visually a superposition of the time-dependent variations of the amplitude of reflection coefficient measured at the first measurement processing;

a second measurement processing including measuring the time-dependent variation of the amplitude of reflection coefficient in a third connection state in which one terminal of the cable assembly is connected to the connecting unit, and other terminal of the cable assembly is connected to the first connector and a fourth connection state in which one terminal of the cable assembly is connected to the connecting unit, and other terminal of the cable assembly is connected to the second connector; and a second output processing including outputting visually a superposition of the time-dependent variations of the amplitude of reflection coefficient measured at the second measurement processing, wherein a half of a time difference between a branch point of the time-dependent variations of the amplitude of reflection coefficient measured at the first measurement processing and a branch point of the time-dependent variations of the amplitude of reflection coefficient measured at the second measurement processing is obtained as the propagation delay time.

20. The method according to claim 19, wherein the first output processing and the second output processing include outputting visually the time-dependent variations of the amplitude of reflection coefficient in the first and the second connection states in different colors, outputting visually the time-dependent variations of the amplitude of reflection coefficient in the third and the fourth connection states in different colors, or outputting visually the time-dependent variations of the amplitude of reflection coefficient in the first to the fourth connection states in different colors.

21. A method of measuring electric characteristics of a cable assembly that is connected via a connecting unit, by outputting a predetermined frequency signal to the cable assembly, measuring an amplitude of reflection coefficient of the predetermined frequency signal, and calculating a propagation delay time of the cable assembly based on a time-dependent variation of the amplitude of reflection coefficient, the method comprising:

measuring the time-dependent variation of the amplitude of reflection coefficient in a first connection state in which a first connector with both terminals open-circuited is connected to the connecting unit, a second connection state in which one terminal of a second connector with other terminal short-circuited, having same propagation delay time as that of the first connector, is connected to the connecting unit, a third connection state in which one terminal of the cable assembly is connected to the connecting unit, and other terminal of the cable assembly is connected to the first connector, and a fourth connection state in which one terminal of the cable assembly is connected to the connecting unit, and other terminal of the cable assembly is connected to the second connector; and outputting visually a superposition of the time-dependent variations of the amplitude of reflection coefficient measured at the measuring, wherein a half of a time difference between a branch point of the time-dependent variations of the amplitude of reflection coefficient in the first and the second connection states and a branch point of the time-dependent variations of the amplitude of reflection coefficient in the third and the fourth connection states is obtained as the propagation delay time.

22. The method according to claim 21, wherein the outputting includes outputting visually the time-dependent variations of the amplitude of reflection coefficient in the first and the second connection states in different colors, outputting visually the time-dependent variations of the amplitude of reflection coefficient in the third and the fourth connection states in different colors, or outputting visually the time-dependent variations of the amplitude of reflection coefficient in the first to the fourth connection states in different colors.

* * * * *